(12) United States Patent
Tanaka

(10) Patent No.: US 6,587,366 B2
(45) Date of Patent: Jul. 1, 2003

(54) FERROELECTRIC MEMORY DEVICE AND METHOD FOR OPERATING FERROELECTRIC MEMORY DEVICE

(75) Inventor: Yasuhiro Tanaka, Tokyo (JP)

(73) Assignee: Oki Electric Industry Co., Ltd. (JP)

( * ) Notice: Subject to any disclaimer, the term of this patent is extended or adjusted under 35 U.S.C. 154(b) by 0 days.

(21) Appl. No.: 09/846,322

(22) Filed: May 2, 2001

(65) Prior Publication Data

US 2001/0040815 A1 Nov. 15, 2001

(30) Foreign Application Priority Data

May 12, 2000 (JP) .................................. 2000-139768

(51) Int. Cl.[7] ............................................. G11C 11/22
(52) U.S. Cl. ................... 365/145; 365/149; 365/230.06
(58) Field of Search ................. 365/145, 149, 365/230.06

(56) References Cited

U.S. PATENT DOCUMENTS 6,097,622 A * 8/2000 Shimizu et al. ............. 365/145
6,111,777 A * 8/2000 Ogiwara et al. ............ 365/145

FOREIGN PATENT DOCUMENTS

JP          07220482 A      8/1995

* cited by examiner

Primary Examiner—Huan Hoang
(74) Attorney, Agent, or Firm—Venable; James R. Burdett

(57) ABSTRACT

A ferroelectric memory device capable of high-speed drive having a word line to which a plurality of memory cells is connected, wherein the plurality of memory cells is divided into at least two memory cell groups, the memory cells configuring one memory cell group are connected to a common plate line, the plate line is activated or deactivated by a plate driver provided for each memory cell group, each of those plate drivers is connected to a word line, and at least one of those plate drivers is provided between memory cell groups that are provided adjacent to each other.

18 Claims, 11 Drawing Sheets

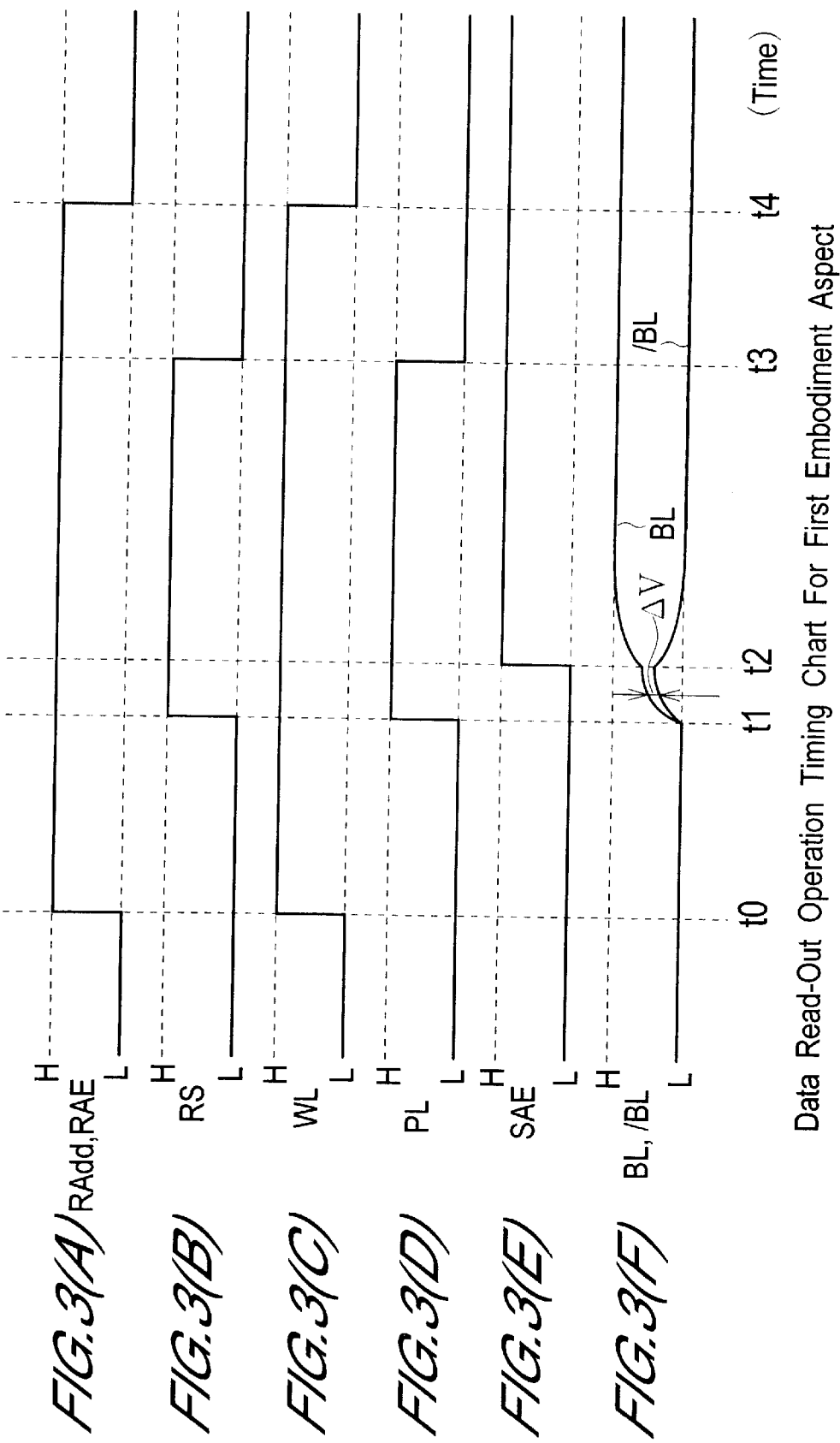

Plate Driver And Word Driver Operating Waveform Characteristics

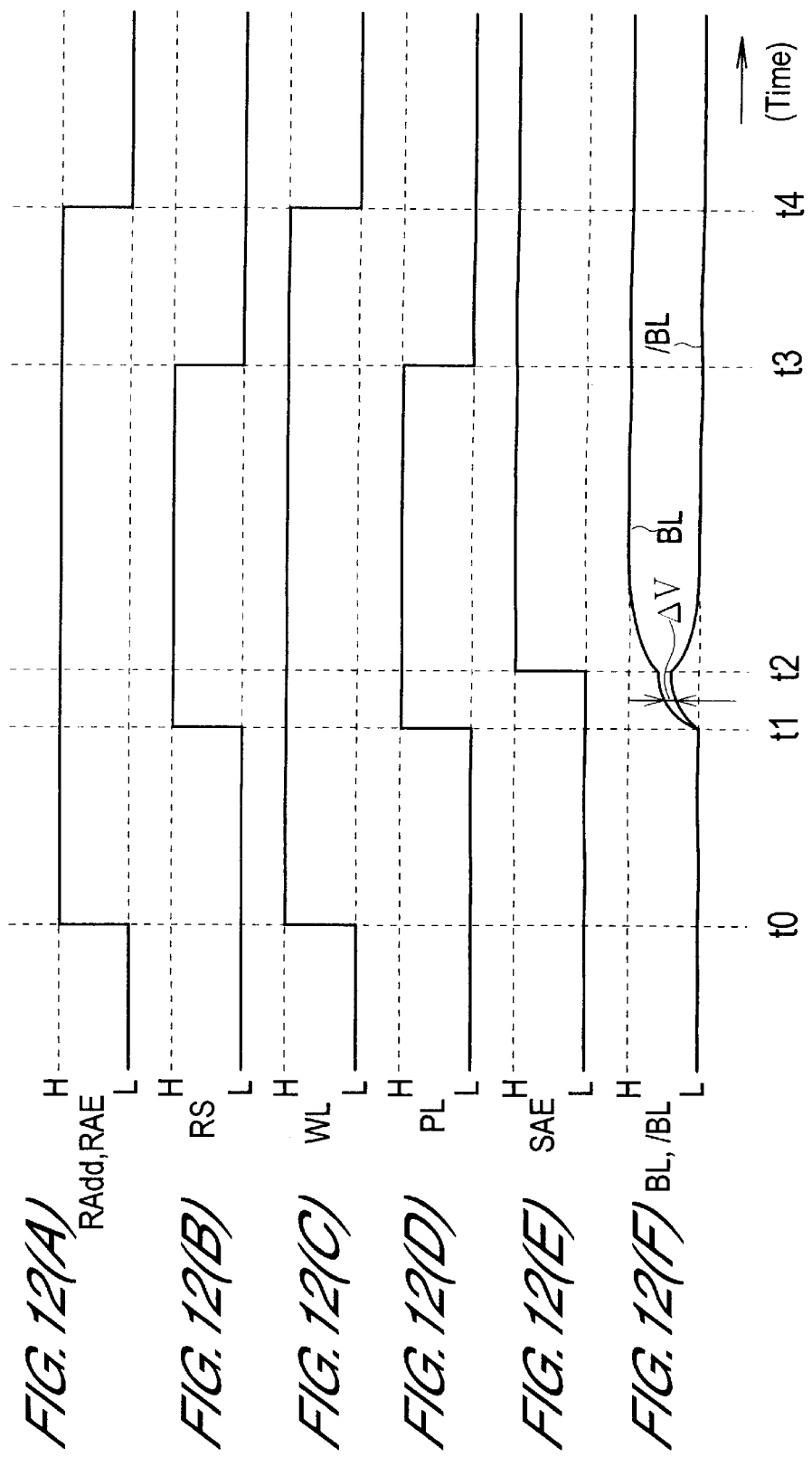

FERROELECTRIC MEMORY DEVICE AND METHOD FOR OPERATING FERROELECTRIC MEMORY DEVICE

BACKGROUND OF THE INVENTION

1. Field of the Invention

This invention relates to a semiconductor memory device, and particularly to a ferroelectric memory device and operation method therefor.

2. Description of Related Art

Conventionally, in semiconductor memory devices, there is well known the so-called DRAM (dynamic memory) wherein electrical charges are stored in capacitors formed internally therein, and wherein data are stored according to the presence or absence of such charges. In recent years, devices wherein ferroelectric films are used as insulative films in such capacitors are being given much attention with respect to their high level of integration, high speed, and low power consumption.

One example of a ferroelectric memory device is disclosed in Reference 1 (T. Sumi et al.: "A 256 kb Nonvolatile Ferroelectric Memory at 3 V and 100 ns," ISSCC Digest of Technical Papers, P 268–269 (February, 1994)." FIG. 11 schematically shows the configuration of the ferroelectric memory device described in Reference 1.

In FIG. 11, one memory cell 508 is representatively diagrammed. In actual practice, however, this kind of memory cell is arranged in a matrix array to form a memory cell array 520.

In the device shown in FIG. 11, a 2T2C type memory cell 508 is configured by two ferroelectric capacitors 500 and 502 and two MOSFETs 504 and 506. The ferroelectric capacitor 500 is connected in series with the MOSFET 504. Similarly, the ferroelectric capacitor 502 is connected in series with the MOSFET 506. The terminals of the ferroelectric capacitors 500 and 502 the are not connected to the MOSFETs 504 and 506 are connected, respectively, to a plate line 510. The MOSFET gates 504x and 506x are connected, respectively, to a word line 512. The terminal of the MOSFET 504 the is not connected to the ferroelectric capacitor 500 is connected to a bit line 514. Similarly, the terminal of the MOSFET 506 the is not connected to the ferroelectric capacitor 502 is connected to a complementary bit line 516. A memory cell array 520 is configured containing the memory cell 508, plate line 510, word line 512, bit line 514, and complementary bit line 516. Both the bit line 514 and the complementary bit line 516 are connected to a common sense amplifier 518. In this device, moreover, a word driver 522 the makes the word line 512 either active (logic level "1" state) or inactive (logic level "0" state) is connected to each word line 512. To the word drivers 522 are connected a row decoder 524 the provides signals for instructing each word driver 522 to operate. To each of the row decoders 524 are applied a row address selection signal (RAdd) and a row decoder energize signal (RAE). When both of these signals are applied to as row decoder 524, the row decoder 524 connected to a specific word line, such as word line 512, for example, is selected to provide a prescribed potential level. To each plate line 510, moreover, is connected a plate driver 526 that puts the plate line 510 at a prescribed potential level. Each plate driver 526 is connected to a word line 512 and when the word line 512 becomes active, a signal that originates in the word line 512 is applied to the plate driver 526. To the plate driver 526 is also applied a control signal (RS) for controlling the operation timing wherewith rows are selected. The plate driver 526, moreover, produces an output corresponding to logic level "1" only when both the control signal (RS) and the signal originating in the word line 512 are applied thereto.

With reference to FIG. 11 and FIG. 12, the operation of reading data out from the ferroelectric memory device shown in FIG. 11 will hereinafter be described. FIG. 12 shows a timing chart for explaining data read operations in the conventional ferroelectric memory device described above. In FIG. 12, the symbol "L" represents a binary "0" (corresponding to logic level "0"), such as the level at ground potential, while the symbol "H" represents a binary "1" (corresponding to logic level "1"), such as the level at the power supply potential. In FIG. 12(F), the potential changes (BL, /BL) of the bit line 514 and complementary bit line 516 are represented, respectively. Here, because the timing wherewith the low decoder energize (or activation) signal (RAE) is applied and the timing wherewith the row address selection signal (RAdd) is applied to the row decoder 524 are substantially coincident, the timing of the application of both of these signals is represented by a common continuous line in FIG. 12(A). FIG. 12(B) shows the timing wherewith the control signal (RS) is applied to the plate line 510, FIG. 12(C) the timing (WL) wherewith the word line 512 becomes either active or inactive, FIG. 12(D) the timing (PL) wherewith the plate line 510 becomes either active or inactive, and FIG. 12(E) the timing (SAE) wherewith the sense amplifier 518 is either energized or deenergized, respectively.

A read operation will be carried out as follows. First, at time t=t0, both the row decoder energize signal (RAE) and the row address selection signal (RAdd) are driven to the "H" level (FIG. 12(A)), respectively. Then, the row decoder 524 is selected, and the output of the row decoder 524 is driven to the "H" level. When the row decoder 524 is selected, the word driver 522 is driven and the word line 512 (WL) is made active, that is, driven to the "H" level (time t=t0 (FIG. 12(C)). Thus a voltage is applied to the gates 504x and 506x of the two MOSFETs and the MOSFETs 504 and 506 are put in a conducting state. When the word line 512 (WL) becomes active, moreover, an "H" level signal is applied to the plate driver 526 connected to the word line 512. (The plate driver becomes in a control signal waiting state).

Next, at time t=t1, when the control signal (RS) goes high "H" (FIG. 12(B)), that is, when the control signal (RS) is applied to the plate driver 526, "H" level signal is output from the plate driver 526, and the plate line 510 (PL) becomes active ("H" level) (time t=t1 (FIG. 12(D))). Thereupon, the charge stored in the ferroelectric capacitor 500 begins to be distributed on the bit line 514. Similarly, the charge stored in the ferroelectric capacitor 502 begins to be distributed on the complementary bit line 516. Beginning at this time (t1), the potentials (BL and /BL) on the bit line 514 and the complementary bit line 516 change, respectively, in response to the distributed potentials (FIG. 12(F)).

Next, a sense amplifier drive signal (SAE) is applied, at time t=t2, for example, to the sense amplifier 518 to which the bit line 514 and complementary bit line 516 are connected (to drive to an "H" level (FIG. 12(E))). Thereby, the sense amplifier 518 latches the potential difference (ΔV) between the potential (BL) appearing on the bit line 514 and the potential (/BL) appearing on the complementary bit line 516 to the potential difference with the power supply voltage level, transfers the difference to a data output circuit 528, and thus outputs the requisite data (FIG. 11).

After that, the ferroelectric capacitors 500 and 502 are restored by driving the control signal (RS) to the "L" level (time t=t3) (FIG. 12(B)).

Last of all, the word line 512 (WL) is made inactive by driving the row address selection signal (RAdd) to the "L" level, (t=t4)(FIG. 12(C)).

In general, the relative permittivity (dielectric constant) of a ferroelectric film is larger than the relative permittivity of a MOSFET oxidation film by roughly a two-digit factor. In the ferroelectric memory device described in the foregoing, moreover, the capacitances of the plurality of ferroelectric capacitors in the memory array are connected to the plate line 510, and the gate capacitances of the plurality of MOSFETs are connected to the word line 512. For that reason, despite the fact that the wiring lengths for both the plate line 510 and word line 512 are equivalent, the total load capacitance connected to the plate line 510 will end up being 30 to 50 times the total load capacitance connected to the word line 512. This results in the problem of the operating speed of the device becoming slow.

In a ferroelectric memory device having the configuration described in the foregoing, even if the size (specifically, the gate width) of the transistors configuring the plate driver 526 that imparts the requisite potential level to the plate line 510 is made large, parasitic resistance and parasitic capacitance will become large too in accordance therewith, so that one may still not expect high operating speeds to be realized in the device. Furthermore, the plate driver 526 in the ferroelectric memory device as shown in FIG. 11 is connected to the word line 512, and is provided on the opposite side from the word driver 522 that makes the word line 512 active, sandwiching the memory cell array 520 therebetween. Accordingly, if the size (specifically, the gate width) of the plate driver 526 is made large, the gate capacitance of the transistors configuring the plate driver 526 will also become large, wherefore the time required for activating the word line 512 (also called the rise time) will end up being increased.

That being so, the debut of a ferroelectric memory device wherewith the operation speed can be made even faster is anxiously awaited.

Ferroelectric memory devices have, prior to this, been proposed with the object of reducing load capacitances connected to plate lines. An example thereof is seen in the device disclosed in Reference 2 (Japanese Unexamined Patent Publication No. 7-220482/1995). Based on the art, a memory cell array is divided into a prescribed number of memory cell groups, and has, for each memory cell group, a divided cell plate line that connects commonly to one electrode of the ferroelectric capacitors in each memory cell. The divided cell plate line is connected to the cell plate line through a transmission transistor.

In the ferroelectric memory device disclosed in Reference 2 noted above, the load capacitances connected to the plate lines can be reduced, wherefore the plate line rise time can be shortened, and thus the operating speed of the device can be made even higher.

Nevertheless, even higher operating speeds are now demanded in ferroelectric memory devices.

SUMMARY OF THE INVENTION

An object of the present invention is to provide a ferroelectric memory device that facilitates achieving higher operating speeds by reducing the load capacitance placed on one plate line further than conventionally.

Another object of the present invention is to provide a ferroelectric memory device that facilitates achieving higher operating speeds by reducing the load capacitance placed on the word line.

Yet another object of the present invention is to provide a ferroelectric memory device the operating speed whereof can be made higher, using control signals from the outside.

Yet another object of the present invention is to provide a ferroelectric memory device wherein the load capacitances placed on the plate lines and sub-word lines are reduced further than conventionally.

Yet another object of the present invention is to provide a ferroelectric memory device the operating speed whereof can be made higher, putting the plate drivers in a condition of being non-connected to the word lines.

Yet another object of the present invention is to provide a ferroelectric memory device that makes it possible to reduce the device layout area while achieving high-speed operation.

And yet another object of the present invention is to provide an operation method for the ferroelectric memory devices described above.

Accordingly, as based on the ferroelectric memory device of the present invention, a plurality of memory cells, word line(s), plate line(s), and plate driver(s) are comprised, and the ferroelectric memory device has the structure described below. That is, the device has a word line to which a plurality of memory cells are connected, and those memory cells are divided between or into at least two memory cell groups. The memory cells configuring (or belonging to) one memory cell group are commonly connected to a plate line. The plate line is driven to either high level or low level by a plate driver provided for each memory cell group. Each of these plate drivers is connected to the word line, and at least one of the plate drivers is placed between memory cell groups that are provided adjacent to each other.

Based on this device, a plurality of memory cells connected to one word line are divided into a plurality of memory cell groups, and to each of those memory cell groups is connected one common plate line. In contrast to this, conventionally, a plurality of memory cells connected to one word line are all connected to one common plate line. Accordingly, in the present invention, because a common plate line is provided for each memory cell group, the number of memory cells connected to any one plate line is fewer than the unmber of conventional ones. That being so, the load capacitance placed on one plate line is made lower than the load capacitance of conventional one, wherefore the size of the transistors in the plate driver that activates or deactivates a plate line may be made smaller than the size of conventional ones. Accordingly, the parasitic resistance and parasitic capacitance of the transistors are reduced and, because of that, the plate line rise time can be shortened.

These plate drivers are connected to the word line, but at least one of these plate drivers is placed between two adjacent memory cell groups connected to the word line, and are connected to the word line. Be implementing this kind of structure, the load capacitance placed on the word line can be reduced below what it can be in a conventional structure wherein a plate driver of large capacitance is provided at the end of a word line opposite that where it is connected to the word driver. Thus the word line rise time can be shortened.

Accordingly, since the rise time in both the plate line(s) and word lines can be shortened, a ferroelectric memory device can be provide which exhibits a faster operating speed than conventionally.

In such a device as this, moreover, it is preferable that the plate driver be driven by word line activation, and by control signals from the outside. By drive here is meant the generation of a first level output. Hence to cause a plate driver to drive, in the present invention, is to have a word line activated (so that the potential on the word line goes to the "H" level), whereby an "H" level (first level) signal is input to the plate driver connected to the word line, and to have an "H" level signal input as a control signal from the outside, whereupon an "H" level signal is output from the plate driver as a first level signal.

According to this configuration, when the potential on a plate line is intended to be driven to the "L" level, the plate line can be driven to the "L" level in a short time by a control signal from the outside.

Preferably, moreover, that control signal from the outside may be made a row address selection signal or a column address selection signal. With such a configuration as this, the plate driver for a plate line connected to a selected memory cell group can be turned off by an address selection signal. Accordingly, the load required in turning a plate driver off can be made smaller than the load required in conventional one, wherefore the operating speed of the device can be made higher. The shortening of the time for turning the plate driver off, in specific terms, is associated with shortening the pre-charge time and cycle time until the next operation.

In another example configuration of the ferroelectric memory device of the present invention, the ferroelectric memory device has memory cell groups each configured by a plurality of memory cells, and the pluralities of memory cells are each connected to a plate line and a sub-word line that are common to each memory cell group. The common plate lines and the common sub-word lines are activated or deactivated by plate drivers and sub-word drivers connected respectively to each of the memory cell groups. The plate drivers are connected to sub-word lines, and the sub-word drivers are connected respectively to a main word line.

Based on a device structured in this way, a plate line and sub-word line are provided for each memory cell group. The number of memory cells connected to one plate line or sub-word line is fewer than conventionally, wherefore the wiring length for the plate lines and sub-word lines is shorter than for conventional word lines. For this reason, the load capacitance placed on each plate line and sub-word line becomes smaller than conventionally. As a consequence, the gate width of the transistor(s) in a plate driver that activates or deactivates one plate line, and the gate width of the transistor(s) in a sub-word driver that drives one sub-word line, may be smaller than conventionally.

When the output of a row decoder is driven to the "H" level by a row decoder energizing signal and a row address selection signal, the main word line to which the sub-word line is connected is activated (goes to the "H" level), but a sub-word driver to be driven can be selected from among a plurality of sub-word drivers connected to that main word line by a column address selection signal. Accordingly, power consumption can be reduced because only the desired sub-word driver is driven.

The sub-word line connected to the sub-word driver is shorter than a conventional word line, moreover, and the number of memory cells connected to the sub-word line is fewer than the number of memory cells connected to a conventional word line, wherefore the sub-word line rise time can be shortened.

Also, since a plate line is provided for each memory cell group, the number of memory cells connected to one plate line is fewer than conventionally. Accordingly, the load capacitance placed on the plate lines is far smaller than conventionally. The gate width of the transistors in the plate drivers that drive the plate lines can be made smaller, moreover, so the parasitic resistance and parasitic capacitance of the transistors can be reduced. Hence the plate line rise time can be shortened.

Accordingly, a ferroelectric memory device can be provided that has an operating speed which is faster than conventionally. In addition, the memory cells driven can be limited by using a column address selection signal to select the sub-word driver to drive, wherefore power consumption can be reduced.

In a device having such a configuration as this, moreover, it is preferable that the sub-word drivers noted above be driven by having an "H" level signal output from the row decoder by a row decoder energizing signal and a row address selection signal, and then have the "H" level output on the main word line activated by those signals and a column address selection signal applied thereto.

Thus, first, when an "H" level signal is output from the row decoder by the row decoder energizing signal and the row address selection signal, the main word line connected to the row decoder becomes active. Thereupon, all of the sub-word drivers connected to the main word line enter a wait state. By wait state is meant a state wherein driving can be done just as soon as a column address selection signal is applied. Next, the column address selection signal is applied to the sub-word driver to be driven. Thus it is possible to drive only the sub-word driver to which the column address selection signal is applied and to cause the output of an "H" level signal as the first level.

In the device described in the foregoing, furthermore, it is preferable that the plate drivers be driven by the activation of the sub-word lines, and by a column block selection signal that, after a row decoder energizing signal and a column address selection signal have been input to a column block selection circuit, is output from the column block selection circuit.

When a sub-word driver is driven (that is, when an "H" level signal is output from a sub-word driver), the sub-word line connected to the sub-word driver becomes active (its level goes to "H"). Thereupon, the plate driver connected to the sub-word line enters a wait state. Also, the row decoder energizing signal and column address selection signal are connected to the column block selection circuit. The column block selection circuit corresponds to the memory cell group(s), and is provided by being connected to the plate drivers. By applying the two signals mentioned above (i.e. the row decoder energizing signal and the column address selection signal) to the column block selection circuit, a column block selection signal is applied to a plate driver. Thus the plate driver is driven, and an "H" level output is generated as the first level. As a result, the plate line connected to the plate driver becomes active.

Accordingly, in this device, the sub-word drivers and plate drivers are finally controlled by the column address selection signals. That being so, each plate driver is controlled to turn on or off by a column address selection signal, wherefore the drive time can be shortened more than conventionally.

In another example configuration of the ferroelectric memory device of the present invention, the ferroelectric memory device has memory cell groups configured by pluralities of memory cells, and each of the pluralities of memory cells is connected to a common plate line and a common word line. These plate and word lines are respectively activated or deactivated by plate drivers and word drivers. The word drivers are driven when an "H" level signal is output from a row decoder, and the plate drivers are driven when an "H" level signal is output from a row decoder and a control signal from the outside is applied.

To the word lines in this device are not connected plate drivers. Thus the load capacitance placed on a word line will decline by the measure of the plate driver, wherefore the word line rise time and fall time can be shortened. As a consequence, the device can be made to operate at high speed.

Also, since the plate drivers and word lines are not connected, no redundant wiring is provided, and connections are easy to make.

In this device, it is preferable that the row decoder be selected by a row address selection signal and a row address energizing signal. By selection here is meant the selection and driving of a desired row decoder from among the row decoders provided for each of the rows, and causing the output of an "H" level signal as a first level signal.

It is also preferable that the control signal from the outside be made either a row address selection signal or a column address selection signal.

It is also preferable, in this device, that each plate driver be connected via a separate wired line to a wired line placed between a row decoder and a word driver.

By effecting such a configuration as this, it becomes possible to put a plate driver in a wait state by selecting and driving a row decoder. Measures are also effected so that a control signal from the outside is also applied to this plate driver. When that is done, by inputting the control signal, the plate driver in the wait state can be driven, and a first level output can be produced on the plate line.

In the device described in the foregoing, moreover, when a structure that contains a memory cell group, plate line, word line, plate driver, and word driver is called a block, a plurality of blocks are aligned in one queue in a direction perpendicular to the word lines or plate lines. When this is done, care is taken not to deploy the plate drivers and word drivers of adjacent blocks on the same side relative to the blocks.

Thus the pitch of the word drivers or plate drivers on one side relative to the blocks can be doubled and, accordingly, layout design can be done easily.

In another example configuration of the ferroelectric memory device of the present invention, the ferroelectric memory device has two memory cell groups configured by pluralities of memory cells, and these pluralities of memory cells are each connected to a common plate line and a common word line. The word line is made active or inactive by a word driver provided for each memory cell group. The two plate lines are respectively connected to a common plate driver. Either one or both of the plate lines are made active or inactive by the plate driver. The word driver is caused to be driven when an "H" level signal is output from a row decoder connected to the word driver. The plate driver is caused to be driven by the activation of one or both of the word lines and a control signal from the outside. That is, the plate driver is driven by the activation of one of the word lines and a control signal, and the plate line connected to the memory cells in the memory cell group on the side of the word line that became active becomes active. When both of the word lines become active and a control signal is input to this plate driver, the plate driver is driven, and both plate lines are made active.

Thus, in this device configuration, a common plate driver is provided for two memory cell groups, wherefore the number of transistors is fewer, and the wiring for applying the control signals is common also. Hence the layout area can be made smaller.

It is preferable that the plate driver such as described above have the configuration described below, for example.

First, the plate driver comprises two MOSFETs, each having a source common thereto, and the source is connected either to the row address selection signal or the column address selection signal. The gate of one of the two MOSFETs, furthermore, is connected to a common word line to one of the memory cell groups, and the drain thereof is connected to a common plate line to one of the memory cell groups. The gate of the other of the two MOSFETs is connected to a common plate line to the other memory cell group.

Furthermore, in a ferroelectric memory device having memory cell groups configured by pluralities of memory cells, wherein the pluralities of memory cells are each connected to a common plate line and a common sub-word line, the common plate lines and common sub-word lines are made active or inactive by a plate driver and a sub-word driver provided for each memory cell group, respectively, the plate drivers are connected to the sub-word lines, the sub-word drivers are connected to main word lines, and the main word lines are connected to row decoders, the operating process steps described below in (1) to (4) are negotiated in performing data read-out operations.

(1) A step for causing a row decoder to be selectively driven by inputting to the row decoder a row decoder energizing signal and a row address selection signal.

(2) A step for putting a sub-word driver in a wait state by inputting a first level (here being an "H" level) output to the main word line from the row decoder by selecting and driving the row decoder, and making the main word line active.

(3) A step for making a sub-word line active by causing an "H" level signal to be output from a sub-word driver to the sub-word line, by applying a column address selection signal to a sub-word driver that is in a wait state.

(4) A step for making a plate line active by inputting a row decoder energizing signal and a column address selection signal to a column block selection circuit and thereby inputting the column block selection signal output from the column block selection circuit to a waiting plate driver so as to cause an "H" level signal to be output from the plate driver to the plate line.

Thus it is possible to control the drive (on or off) of the plate drivers by column address selection signals, and therefore to shorten the operating time.

Furthermore, in operating a ferroelectric memory device configured such that it has memory cell groups configured by pluralities of memory cells, and wherein the pluralities of memory cells are each connected to a common plate line and a common word line, those plate lines and word lines are connected respectively to plate drivers and word drivers, and control signals are applied to those plate drivers from the outside, the operating process steps noted in (i) to (iii) below should be comprised.

(i) A step for causing a row decoder to be selectively driven, and causing an "H" level signal to be output as a first level signal from the row decoder, by inputting to the row decoder a row decoder energizing signal and a row address selection signal.

(ii) A step for causing a word driver connected to a row decoder to drive, making a word line active, and putting a plate driver connected to the row decoder in a wait state, by the output of an "H" level signal from the row decoder.

(iii) A step for causing a plate driver to drive and making a plate line active by applying a control signal to the plate driver in a wait state.

Thus putting a plate driver in a wait state is controlled by the output of an "H" level signal from a row decoder. Specifically, the plate driver is controlled not with a word line being active but with an address selection signal. Accordingly, the load placed on the word line can be made smaller, and the plate driver can be caused to be driven without raising the voltage.

BRIEF DESCRIPTION OF THE DRAWINGS

The forgoing and other objects, features and advantages of the present invention will be better understood from the following description taken in connection with the accompanying drawings, in which:

FIG. 3 including FIG. 3(A)–FIG. 3(F) is an operation timing chart for reading out data from the ferroelectric memory device of the first embodiment for explaining the present invention;

–FIG. 6(G) is an operation timing chart for reading out data from the ferroelectric memory device of the second embodiment for explaining the present invention;

FIG. 12 including FIG. 12(A) –FIG. 12(F) is an operation timing chart for reading out data from a conventional ferroelectric memory device.

DESCRIPTION OF THE PREFERRED EMBODIMENTS

With reference to the drawings, detailed description will hereinafter be given to embodiments of the present invention.

<First Embodiment>

Figure 1:
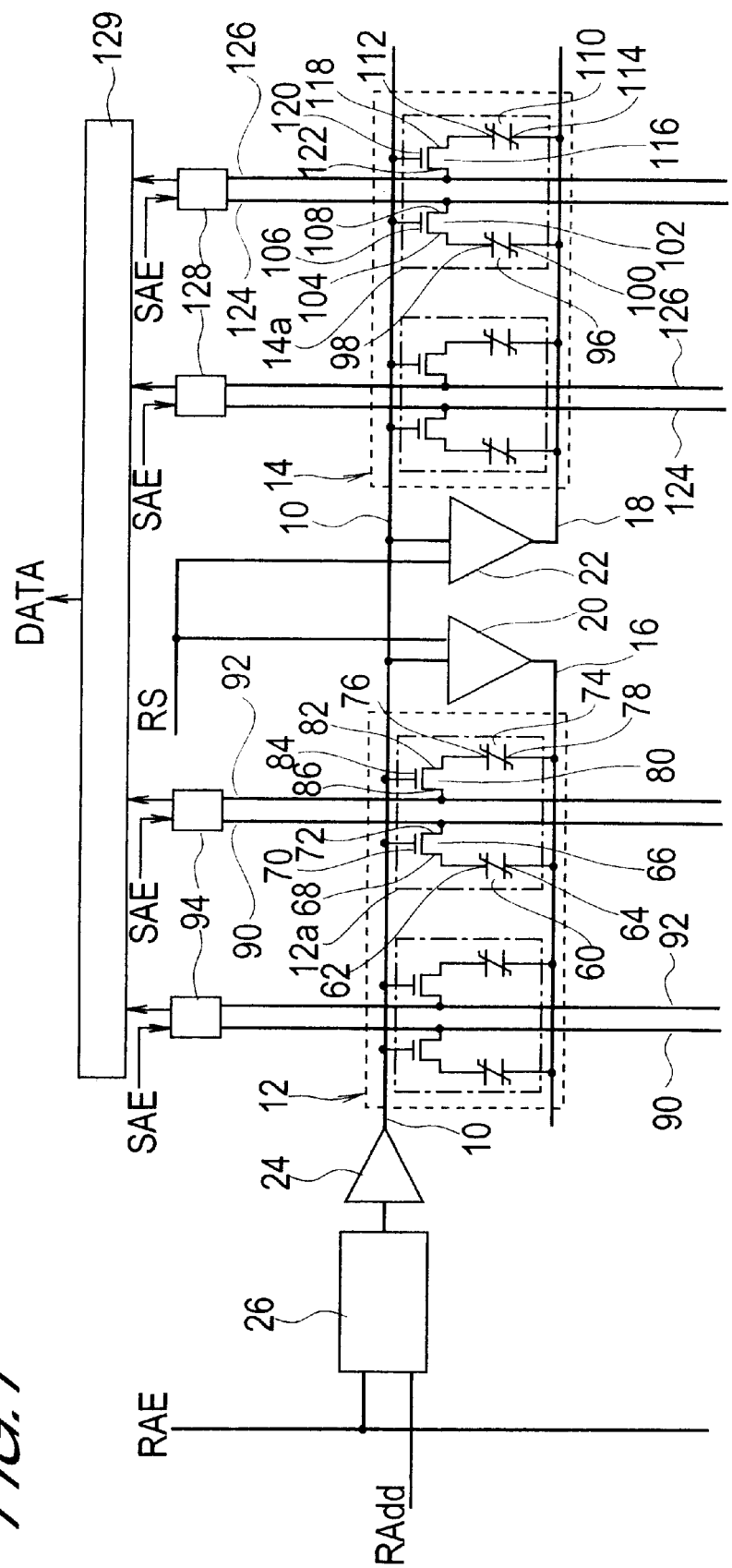
FIG. 1 is a schematic configuration diagram of a ferroelectric memory device in a first embodiment of the present invention.

FIG. 1 schematically shows a principal portion of the configuration of a ferroelectric memory device in according to a first embodiment of the present invention.

This ferroelectric memory device comprises a plurality of memory cells made into a matrix array, and pluralities of bit lines and complementary bit lines that cross (at right angles, for example) (a) word line(s) and plate lines. Each memory cell is connected to the requisite word line and plate line, and is also connected to a bit line or a complementary bit line. In this embodiment, the memory cells hay a word line 10 to which a plurality of 2T2C type memory cells is connected. These memory ells are divided between or into groups, such as two memory cell groups, for example, namely a first memory cell group 12 and a second memory cell group 14. A memory cell group can contain, as shown, four memory cells. The memory cells configuring one memory cell group are connected to a common plate line. That is, the memory cells are connected to a different plate line in each memory cell group. In this example, a first plate line 16 is connected to each of the memory cells (to memory cell 12a, for example) configuring the first memory cell group 12. A second plate line 18 is connected to each of the memory cells (to memory cell 14a, for example) configuring the second memory cell group 14. These plate lines are made active ("H" level) or inactive ("L" level) by plate drivers, one each whereof is provided for each memory cell group. In this example, to the first plate line 16 is connected a first plate driver 20, and to the second plate line 18 is connected a second plate driver 22. Also, two plate drivers 20 and 22 are connected to a portion of the word line that is between memory cell groups connected adjacently to the common word line 10, specifically, between the first and second memo cell groups 12 and 14, for example. That is, one or more plate drivers, specifically, the plate drivers 20 and 22, for example, are positioned between the two adjacent memory cell groups 12 and 14. Also, at least one of the plate drivers 20 and 22, respectively, is connected to the word line 10 between the point(s) of connection between the memory cells in the first memory cells 12 and the word line 10, on the one hand, and the point(s) of connection between the memory cells in the second memory cell group 14 and the word line 10 on the other.

Furthermore, each of the plate drivers 20 and 22 mentioned above is driven by the logical product between an enable signal of the word line 10 and an "H" level control signal (RS) for controlling the plate drivers 20 and 22 which is supplied from an outside terminal, thereby outputting the "H" level signal therefrom. In order to turn off only the plate driver for a plate line that is connected to a selected memory cell group, it is only necessary to drive the control signal (RS) from the outside to the "L" level.

Figure 2A:
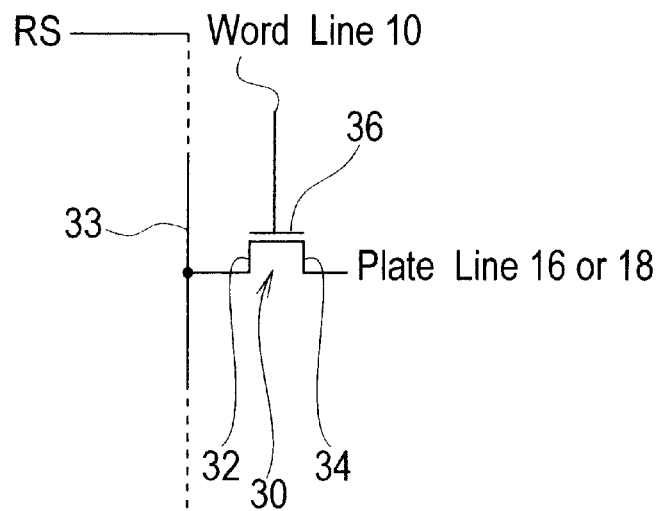
FIGS. 2(A) and 2(B) are plate driven circuit diagrams for explaining the present invention, respectively.
Figure 2B:
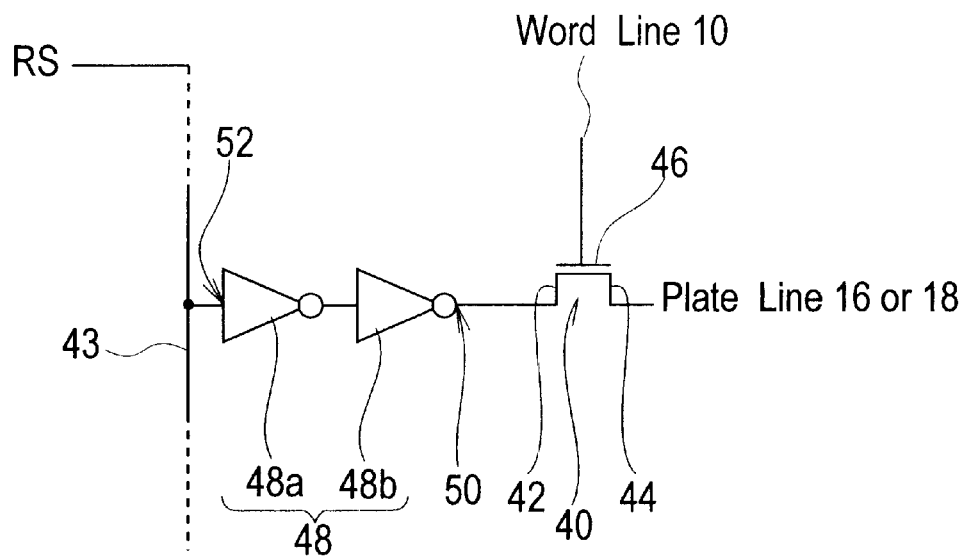

For such plate drivers 20 and 22, circuits having the configuration shown in FIG. 2(A) or FIG. 2(B), for example, may be used. The circuit shown in FIG. 2(A) is a MOSFET 30. To a first main electrode 32 in the MOSFET 30 is provided a wired line 33 so that control signals are applied. To a second main electrode 34 is connected either the plate line 16 or 18. To the control electrode 36 of the MOSFET 30 is connected the word line 10. Thus when the word line 10 becomes active, an "H" level voltage is applied to the control electrode 36 of the MOSFET 30, whereupon the main current path of the MOSFET 30 is put in a conducting state. Subsequently, when an "H" level control signal is input to the first main electrode 32, charges move from the first main electrode 32 side to the second main electrode 34 side and the plate line 16 or 18 becomes active (goes high level "H").

In the circuit shown in FIG. 2(B), two inverter circuits 48 are provided in series between a wired line 43 for control signal input and a first main electrode 42 of a MOSFET 40 like that in the circuit shown in FIG. 2(A). With such the construction, the drive speed can be made faster. The output terminal 50 of the inverter circuit 48b is connected to the MOSFET 40 on the first main electrode 42 side. To the second main electrode 44 side thereof is connected the plate line 16 or 18, and to the control electrode 46 thereof is connected the word line 10. To the input terminal 52 of the inverter circuit 48a is connected the wired line 43 for control signal input.

Each word line, specifically, the word line 10, for example, is individually connected to a word driver 24 for activating or deactivating the word line 10. Each word driver, specifically, word driver 24, for example, is also connected to a row decoder 26. Moreover, each row decoder, specifically, the row decoder 26, for example, is selectively driven by the logical product of a row address selection signal (RAdd) and a row decoder energizing signal (RAE) input thereto, to thereby output an "H" level signal therefrom (FIG. 1).

The memory cells configuring the memory cell groups have the configuration as hereinafter described. The configuration of each memory cell group is respectively identical, wherefore a memory cell 12a in the first memory cell group 12 is here described as a representative example. The memory cell 12a comprises a first ferroelectric capacitor 60 and a first selection transistor 66 having one end 68 of the main current path therein connected to one electrode 62 of the first ferroelectric capacitor 60. To a control electrode 70 of the first selection transistor 66 is connected the word line 10. To the other end 72 of the main current path in the first selection transistor 66 is connected a first bit line 90. To the other electrode 64 of the first ferroelectric capacitor 60 is connected the first plate line 16. The memory cell 12a also comprises, in similar fashion, a second ferroelectric capacitor 74 and a second selection transistor 80 having one end 82 of the main current path therein connected to one electrode 76 of the second ferroelectric capacitor 74. To the control electrode 84 of the second selection transistor 80 is connected the word line 10. To the other end 86 in the main current path of the second selection transistor 80 is connected a first complementary bit line 92. Also, to the other electrode 78 of the second ferroelectric capacitor 74 is connected the first plate line 16. The first bit line 90 and the first complementary bit line 92 are connected to a common sense amplifier 94.

Each of the memory cells in the second memory cell group 14, such as the memory cell 14a, for example, has the same configuration as the memory cell 12a described above.

The memory cell 14a comprises a first ferroelectric capacitor 96 and a first selection transistor 102 having one end 104 of the main current path therein connected to one electrode 98 of the first ferroelectric capacitor 96. To the control electrode 106 of the first selection transistor 102 is connected the word line 10. To the other end 108 of the main current path in the first selection transistor 102 is connected a second bit line 124. To the other electrode 100 of the first ferroelectric capacitor 96 is connected the second plate line 18. The memory cell 14a also comprises, in similar fashion, a second ferroelectric capacitor 110 and a second selection transistor 116 having one end 118 of the main current path therein connected to one electrode 112 of the second ferroelectric capacitor 110. To the control electrode 120 of the second selection transistor 116 is connected the word line 10. To the other end 122 in the main current path of the second selection transistor 116 is connected a second complementary bit line 126. Also, to the other electrode 114 of the second ferroelectric capacitor 110 is connected the second plate line 18. The second bit line 124 and the second complementary bit line 126 are connected to a common sense amplifier 128. The sense amplifier 128 is also connected to a data output circuit 129.

Next, with reference to FIG. 3, the description will be given to the data read-out operations in the device shown in FIG. 1. FIG. 3 is a timing chart that represents read-out operations. The symbol "L" in FIG. 3 represents the ground potential level (corresponding to logic level "0"), while the symbol "H" represents the power supply potential level (corresponding to logic level "1"). FIG. 3(F) shows the respective potential changes (BL, /BL) on the first bit line 90 and the first complementary bit line 92 connected to the memory cell 12a. Each of various timings are also represented together on the time axis in FIG. 3, namely: the timing wherewith the row decoder energizing signal (RAE) and the row address selection signal (RAdd) are applied to the row decoder 26 (FIG. 3(A)); the timing wherewith the control signal (RS) is applied to the first and second plate drivers 20 and 22 (FIG. 3(B)); the timing wherewith the word line (WL) 10 becomes active or inactive (FIG. 3(C)); the timing wherewith the first and second plate lines (PL) 16 and 18 become active or inactive (FIG. 3(D)); and the timing wherewith the sense amplifier drive signal (SAE) is applied that energizes or deenergizes the sense amplifier 94 (FIG. 3(E)).

To perform a read-out operation, first, at time t=t0, the row address selection signal (RAdd) and the row decoder energizing signal (RAE) are respectively driven to the "H" level, and the row decoder 26 is selectively driven and made to output an "H" level signal (FIG. 3(A)). When the row decoder 26 is driven, the word driver 24 begins driving, and, as a consequence, the word line (WL) 10 is activated, that is, goes to the "H" level (time t=t0 (FIG. 3(C))). Thereupon, a voltage is applied to the control electrode 70 of the first selection transistor 66. When the word line 10 goes active, moreover, an "H" level signal is applied to the first plate driver 20 and the second plate driver 22 that are connected to the word line 10.

Next, at time t=t1, the control signal (RS) is driven to the "H" level (FIG. 3(B)). Thereupon, an "H" level signal is applied to the first and second plate drivers 20 and 22, the first and second plate drivers 20 and 22 become active, and an "H" level signal is output on the first and second plate lines (PL) (FIG. 3(D)). Thereupon, in the memory cell 12a, the charge stored in the first ferroelectric capacitor 60 is distributed to the first bit line 90, and the charge stored in the second ferroelectric capacitor 74 (i.e. a charge that is complementary to the charge stored in the first ferroelectric capacitor 60) is distributed to the first complementary bit line 92. In the memory cell 14a, meanwhile, the charge stored in the first ferroelectric capacitor 96 is distributed to the second bit line 124, and the charge stored in the second ferroelectric capacitor 110 is distributed to the second complementary bit line 126.

When this occurs, the potentials (BL, /BL) on the bit line and complementary bit line will vary, respectively, according to the charges distributed thereto (time t=t1). Looking at the first bit line 90, for example, the potential (BL) on the first bit line 90 will become higher than the potential on the first complementary bit line 92, as shown in FIG. 3(F).

Next, at time t=t2, a sense amplifier drive signal (SAE) is applied to the sense amplifier 94 connected to the first bit line 90 and the first complementary bit line 92 (driving an "H" level). Thereupon, the sense amplifier 94 latches the potential difference (ΔV) between the potential (BL) appearing on the first bit line 90 and the potential (/BL) appearing on the first complementary bit line 92 to the potential difference at the power supply voltage level, and transfers that to the data output circuit 129 (FIG. 1). The output circuit 129 outputs those data (time t=t2 (FIGS. 3(E) and 3(F))).

After that, at time t=t3, the control signal (RS) is driven to the "L" level (FIG. 3(B)). Thereupon, the ferroelectric capacitors from which the data were read out are rewritten to (time t=t3).

Last of all, at time t=t4, by driving the row address selection signal (RAdd) to go to the "L" level, the word line 10 (WL) is deactivated, whereupon the read-out operation ends.

In this device, as already described, a plurality of memory cells connected to one word line 10 is divided between or into two memory cell groups 12 and 14, and each memory cell group is provided with plate lines 16 and 18 and with plate drivers 20 and 22. Thus the load capacitance loaded (or placed) on one plate line is made roughly half what it is conventionally. For this reason, the gate width in the transistor(s) of the plate driver that activates and deactivates the plate line need only be roughly half what it needs to be conventionally. Accordingly, transistor parasitic resistance and parasitic capacitance are reduced. For that reason, the plate line rise time can be shortened.

The plate drivers 20 and 22 are connected to the part of the word line 10 that is between the first memory cell group and the second memory cell group that are connected to the word line 10 adjacent to each other, furthermore, wherefore the load capacitance placed on the word line can be made smaller than when the plate driver is connected to the end of the word line. Accordingly, rise time of the word line 10 can be further shortened.

Figure 4A:
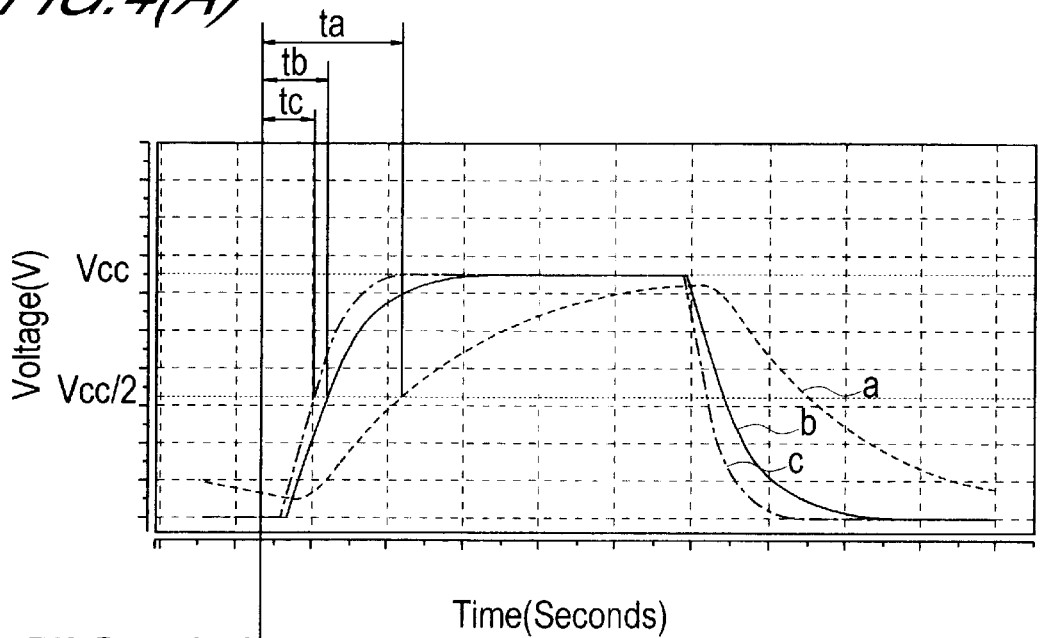
FIG. 4(A) is a characteristic-curve diagram representing the operation waveforms for a plate driver in the ferroelectric memory device of the first embodiment of the present invention.
Figure 4B:
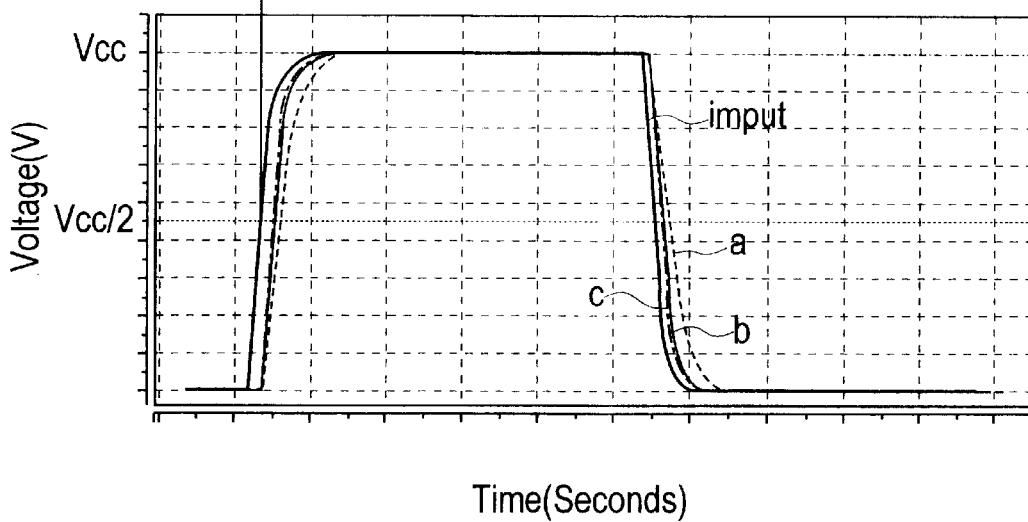
FIG. 4(B) is a characteristic-curve diagram representing the operation waveforms for a word driver in the ferroelectric memory device of the first embodiment of the present invention.

FIG. 4 shows operating time and voltage characteristics for the plate drivers 20 and 22 and the word driver 24 in this embodiment. It should be noted, however, that these characteristics are based on the results of simulations. FIG. 4(A) is a characteristic diagram representing plate driver operation waveforms, while FIG. 4(B) is a characteristic diagram representing word driver operation waveforms. In FIG. 4(A), the dash line a is a characteristic curve for a plate driver in a conventional ferroelectric memory device wherein one plate driver is connected to the end of the word line. The solid line b therein is an output waveform for the plate drivers in the ferroelectric memory device of the first embodiment (i.e. for two plate drivers configured by transistors having approximately half the sizes (gate widths) of those in a conventional plate driver). The dot and dash line c therein is a characteristic curve for a plate driver in a ferroelectric memory device wherein four plate drivers configured by transistors each having one quarter the gate width as conventionally are respectively connected to the word line. FIG. 4(B) shows word driver characteristic curves for the cases shown in FIG. 4(A) as the dash line a, solid line b, and dot and dash line c. The "input" indicated by the other solid line in FIG. 4(B) represents the input to the word driver 24.

In these diagrams, time (in seconds) is plotted on the horizontal axis and voltage (in volts) is plotted on the vertical axis. Also, the times elapsing from when the input to the word driver 24 in FIG. 4(B) becomes Vcc/2 until the output of each plate driver becomes Vcc/2 are made delay times ta, tb, and tc.

As a result, for the plate drivers, in the first embodiment, the rise delay time tb can be shortened by 50% over the rise delay time ta of a conventional plate driver. Furthermore, by using four plate drivers, a 60% shortening can be effected over the conventional plate driver rise delay time ta, as indicated in FIG. 4(A) at tc. The fall delay times also can be significantly shortened, over what they are conventionally, in the plate drivers of the first embodiment.

For the word driver, furthermore, it is known that the word driver rise delay times and fall delay times are about the same in both of the ferroelectric memory device of the first embodiment and the ferroelectric memory device wherein quarter-size plate drivers are provided, and that these are shortened over what they are conventionally (FIG. 4(B)).

Accordingly, in this embodiment, although the number of plate drivers is two, the gate width in the transistors configuring the plate drivers is approximately half the conventional width, so the gate width sum is unchanged from what it is conventionally. Accordingly, the device can be configured with the same chip area as conventionally. Also, the plate driver rise delay time and fall delay time can be made shorter than conventionally, wherefore, by that measure, power consumption can be reduced approximately 10% over what it is conventionally.

If the control signal applied to a plate driver is a row address selection signal or column address selection signal, moreover, the load incurred when stopping the drive of the plate driver (turning it off) may be made smaller. As a consequence, it is also possible to shorten the pre-charge time and cycle time up until the plate driver is next caused to drive. Thus the operating speed of the device can be made fast.

In the ferroelectric memory device of this embodiment, furthermore, plate lines for memory cells not being operated are not made active, wherefore there is no fear of any deterioration in retention characteristics (i.e. ferroelectric capacitor polarization retaining characteristics) due to disturbances in the plate lines.

<Second Embodiment>

Figure 5:
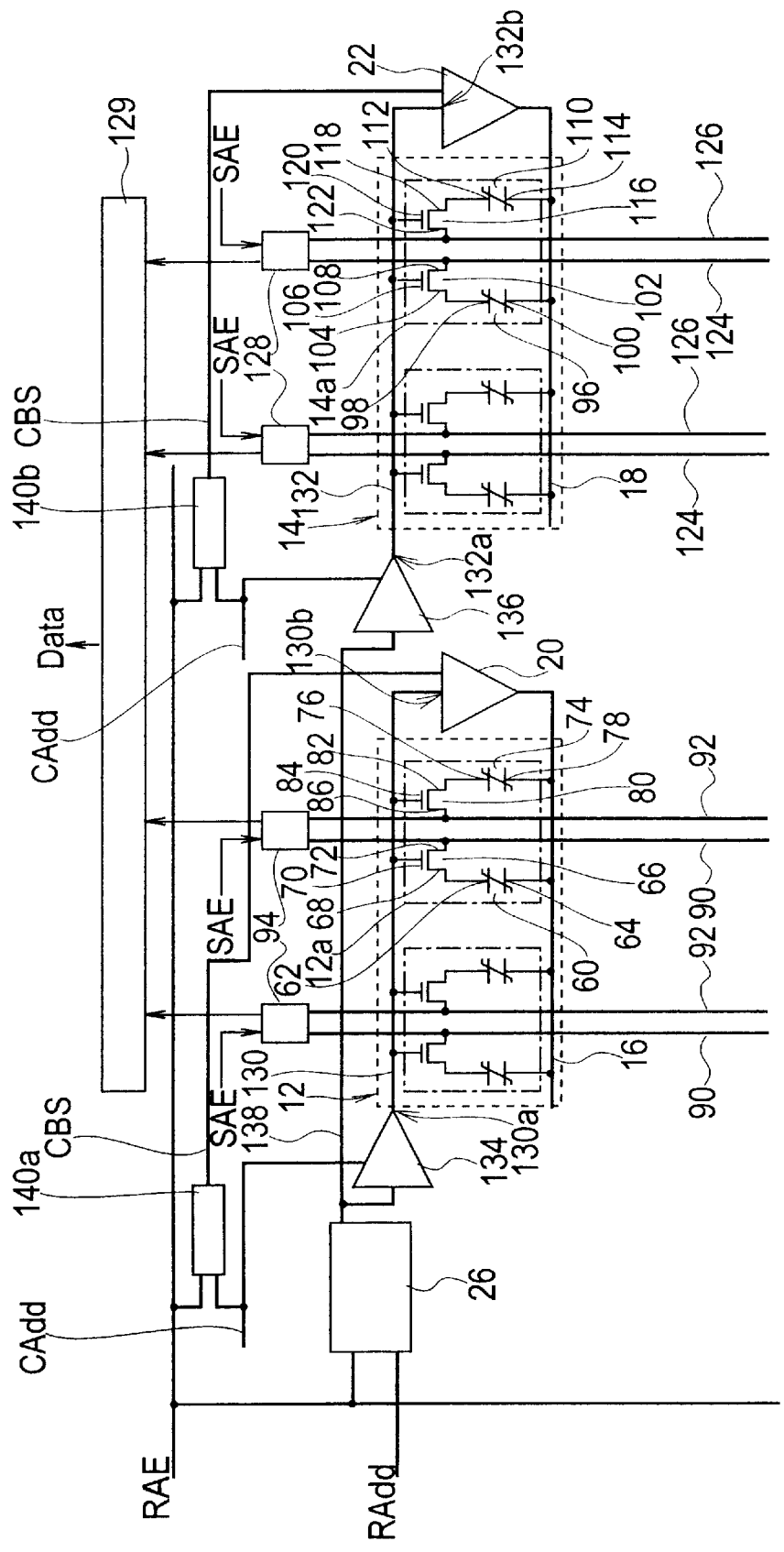
FIG. 5 is a schematic configuration diagram of a ferroelectric memory device in a second embodiment of the present invention.

FIG. 5 shows schematically a principal portion of the configuration of a ferroelectric memory device according to a second embodiment of the present invention.

The ferroelectric memory device shown in FIG. 5 comprises a plurality of memory cells in a matrix array configuration, and a plurality of bit lines and complementary bit lines that cross a main word line and plate lines at right angles. The memory cells are connected to requisite subword lines and plate lines that are connected to the main word line, and are also connected to bit lines or complementary bit lines. These memory cells are divided into (or between) memory cell groups, that is, into a first memory cell group 12 and a second memory cell group 14. A memory cell group can contain, as shown, four memory cells. The memory cells that configure these memory cell groups are respectively connected to a common plate line and a common sub-word line. In this example, each memo cell (specifically memory cell 12a, for example) that configures the first memory cell group 12 is connected respectively to a first plate line 16 and a first sub-word line 130, while each memory cell (specifically memory cell 14a, for example) that configures the second memory cell group 14 is connected respectively to a second plate line 18 and a second sub-word line 132.

The plate lines and sub-word lines are made active ("H" level) and inactive ("L" level), respectively, by plate drivers and sub-word drivers provided for each memory cell group. In this example, the first plate line 16 is connected to the first plate driver 20 and is made active by the drive of the first plate driver 20. In like manner, the second plate line 18 is connected to the second plate driver 22 and is made active by the drive of the second plate driver 22. To one end 130a of the first sub-word line 130 is connected the first sub-word driver 134, and the first sub-word line 130 is made active by the drive of the first sub-word driver 134. To one end 132a of the second sub-word line 132 is connected the second sub-word driver 136, and the second sub-word line 132 is made active by the drive of the second sub-word driver 136.

The plate drivers are connected to the sub-word lines, and the sub-word drivers are respectively connected to the main word line. In this example, the first plate driver 20 is connected to the other end 130b of the first sub-word line 130, and the second plate driver 22 is connected to the other end 132b of the second sub-word line 132. The first and second sub-word drivers 134 and 136 are connected to the main word line 138.

The main word line 138 is also connected to the row decoder 26. By the application of a row decoder energizing signal (RAE) and a row address selection signal (RAdd) to the row decoder 26, an "H" level signal is output from the row decoder 26. By the "H" level output, the main word line 138 is made active ("H" level), and the first and second sub-word drivers 134 and 136 connected to the main word line 138 are put in a wait state. This wait state is a state such that a sub-word driver will be caused to drive as soon as a column address selection signal (CAdd) is applied to the sub-word driver. The column address selection signal (CAdd) is able to selectively cause the sub-word drivers to drive. Accordingly, by selectively applying the column address selection signal (CAdd), it is possible to cause only the first sub-word driver 134 to drive, for example. By the drive, it is possible to make only the first sub-word line 130 active. When the first sub-word line 130 becomes active, furthermore, the first plate driver 20 connected to the first sub-word line 130 is put in a wait state.

A plate driver that has been put in the wait state by the sub-word line going active is made to drive by the application of a column block selection signal (CBS) generated from one of the column block selection circuits 140 (140a and 140b) by a row decoder energizing signal (RAE) and a column address selection signal (CAdd). These column block selection circuits 140 are provided for each memory cell group. To these column block selection circuits 140 are input a row decoder energizing signal (RAE) and a column address selection signal (CAdd), and a column block selection signal (CBS) is output therefrom. The signal (CBS) is input to the corresponding plate driver, which, in this example, is the first plate driver 20. Accordingly, when the column block selection signal (CBS) is applied to the first plate driver 20 that is in the wait state due to the first sub-word line 130 being active, the first plate driver 20 drives and the first plate line 16 connected thereto becomes active.

For the plate drivers, either of the circuits shown in FIGS. 2(A) and 2(B) as described in conjunction with the first embodiment can be used. When the circuit shown in FIG. 2(A) is used, in this embodiment, the output terminals of the column block selection circuits 140 are connected to the first main electrode 32 of the MOSFET 30. To the second main electrode 34 of the MOSFET 30 are connected the plate lines. To the control electrode 36 of the MOSFET 30 are connected the sub-word lines. The same applies when the circuit shown in FIG. 2(B) is used.

The configuration of the memory cells configuring the memory cell groups is also the same as in the first embodiment. In the memory cell 12a in the first memory cell group 12, for example, are comprised a first ferroelectric capacitor 60 and a first selection transistor 66 having one end 68 in the main current path thereof connected to one electrode 62 of the first ferroelectric capacitor 60. To the control electrode 70 of the first selection transistor 66 is connected the first sub-word line 130. To the other end 72 of the main current path in the first selection transistor 66 is connected the first bit line 90. To the other electrode 64 of the first ferroelectric capacitor 60 is connected the first plate line 16. In like manner, a second ferroelectric capacitor 74 and a second selection transistor 80 having one end 82 of the main current path therein connected to one electrode 76 of the second ferroelectric capacitor 74 are comprised. To the control electrode 84 of the second selection transistor 80 is connected the first sub-word line 130. To the other end 86 of the main current path in the second selection transistor 80 is connected the first complementary bit line 92. To the other electrode 78 of the second ferroelectric capacitor 74 is connected the first plate line 16. The first bit line 90 and the first complementary bit line 92 mentioned above are connected to a common sense amplifier 94.

In the memory cell 14a, for example, in the second memory cell group 14, are comprised a first ferroelectric capacitor 96 and a first selection transistor 102 that has one end 104 of the main current path therein connected to one electrode 98 of the first ferroelectric capacitor 96. To the control electrode 106 of the first selection transistor 102 is connected the second sub-word line 132. To the other end 108 of the main current path of the first selection transistor 102 is connected the second bit line 124. To the other electrode 100 of the first ferroelectric capacitor 96 is connected the second plate line 18. In like manner, a second ferroelectric capacitor 110 and a second selection transistor 116 having one end 118 of the main current path therein connected to one electrode 112 of the second ferroelectric capacitor 110 are comprised. To the control electrode 120 of the second selection transistor 116 is connected the second sub-word line 132. To the other end 122 of the main current path of the second selection transistor 116 is connected the second complementary bit line 126. To the other electrode 114 of the second ferroelectric capacitor 110 is connected the second plate line 18. The second bit line 124 and the second complementary bit line 126 already explained above are connected to a common sense amplifier 128.

Figure 6:
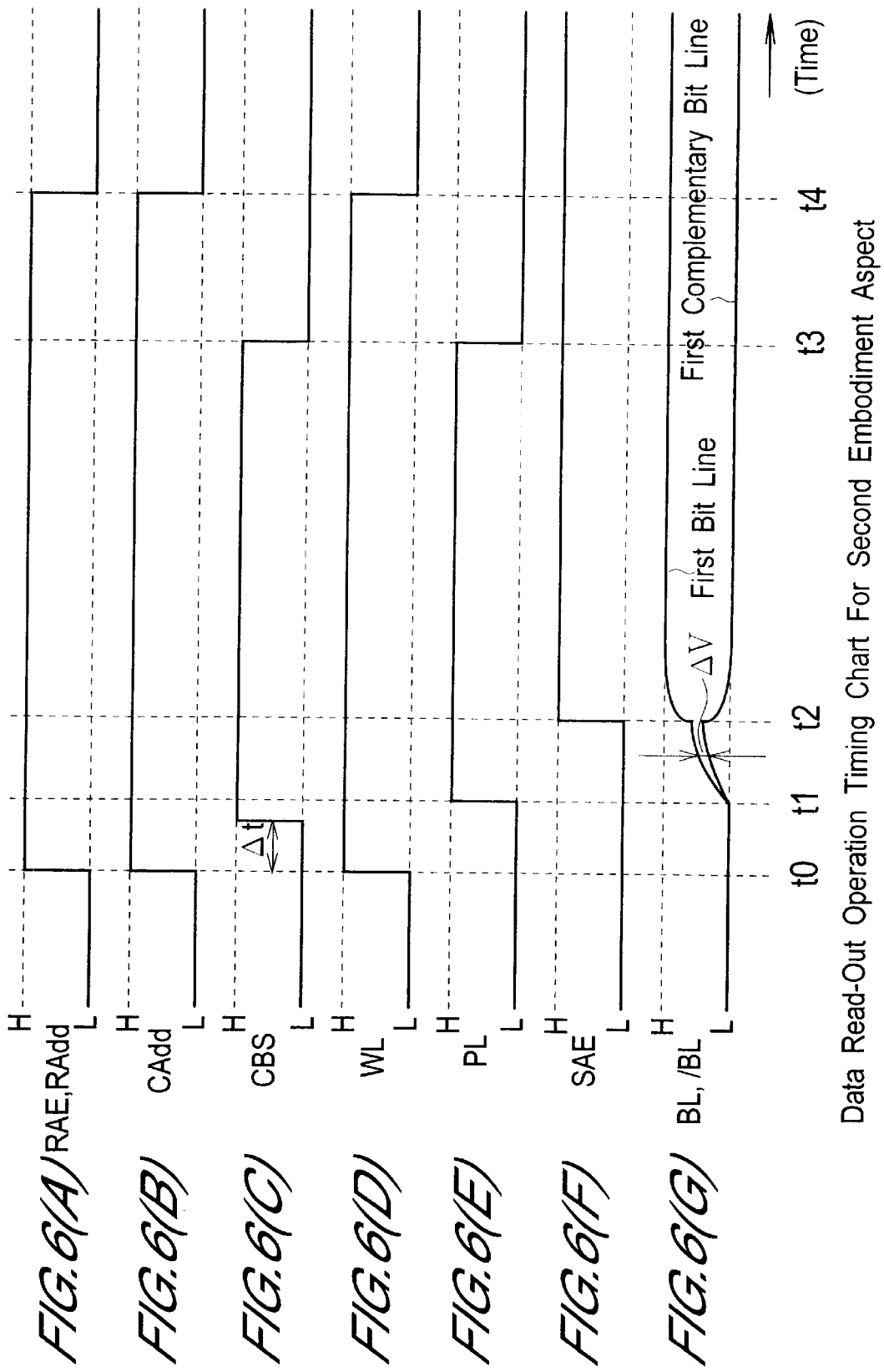
FIG. 6 including FIG. 6(A)

With reference FIG. 6, description will hereinafter be given to data read-out operations in the ferroelectric memory device of the second embodiment. FIG. 6 is a timing chart that represents read-out operations. As in the case shown in FIG. 3, in this diagram the symbol "L" represents a ground potential level and the symbol "H" represents the power supply potential level. FIG. 6(G) shows the respective potential changes (BL, /BL) on the first bit line 90 and the first complementary bit line 92 connected to the memory cell 12a. Each of various timings are also represented together in FIG. 6, namely: the timing wherewith the row decoder energizing signal (RAE) and the row address selection signal (RAdd) are applied to the row decoder 26 (FIG. 6(A)); the timing wherewith the column address selection signal (CAdd) is input (FIG. 6(B)); the timing wherewith a column block selection signal (CBS) is output from the column block selection circuit 140 (FIG. 6(C)); the timing wherewith the first sub-word line (WL) 130 becomes active or inactive (FIG. 6(D)); the timing wherewith the first plate line (PL) becomes active or inactive (FIG. 6(E)); and the timing wherewith the sense amplifier 94 is energized or deenergized (sense amplifier drive signal: SAE).

To perform a read-out operation, first, at time t=t0, the row decoder energizing signal (RAE), row address selection signal (RAdd), and column address selection signal (CAdd), respectively, are driven to the "H" level (FIGS. 6(A) and 6(B)). Thereupon, the row decoder 26 is selectively driven and an "H" level signal is output. When the row decoder 26 is driven, the main word line 138 becomes active (goes to the "H" level). When the main word line 138 becomes active, a signal is applied to the first and second sub-word drivers 134 and 136 connected thereto. Roughly simultaneously with that signal application, the column address selection signal (CAdd) is input, in this example to the first sub-word driver 134. Thereupon, the first sub-word driver 134 is selectively driven and the first sub-word line (WL) 130 is made active (time t=t0 (FIG. 6(D))). Thereupon, in the memory cell 12a connected to the first sub-word line (WL) 130, a voltage is applied to the control electrode 70 of the first selection transistor 66 and to the control electrode 84 of the second selection transistor 80.

When the first sub-word line (WL) 130 becomes active, the first plate driver 20 connected thereto goes into a wait state. When a row decoder energizing signal (RAE) and column address selection signal (CAdd) go to the "H" level, these signals are input to the column block selection circuit 140, and, after they are subjected to logic processing in the column block selection circuit 140, a column block selection signal (CBS) is output from the column block selection circuit 140. This column block selection signal (CBS) is generated later than time t0 by the time (Δt) required for that logic processing (FIG. 6(C)), and is input to the first plate driver 20 that is in the wait state. Thereupon, the first plate driver 20 drives and the first plate line (PL) 16 becomes active (time t=t1 (t1>t0) (FIG. 6(E))). Thereupon, in the memory cell 12a, the charge stored in the first ferroelectric capacitor 60 is distributed to the first bit line 90, and the charge stored in the second ferroelectric capacitor 74 is distributed to the first complementary bit line 92. At this time, the potentials (BL, /BL) on the first bit line 90 and the first complementary bit line 92 vary, respectively, according to the charges distributed. In this example, as shown in FIG. 6(G), the potential (BL) on the first bit line 90 becomes higher than the potential (/BL) on the first complementary bit line 92.

Next, at time t=t2, the sense amplifier 94 to which the first bit line 90 and the first complementary bit line 92 are connected is energized. That is, a sense amplifier drive signal (SAE) is applied (driving to the "H" level). Thereupon, the sense amplifier 94 latches the potential difference (ΔV) between the potential (BL) appearing on the first bit line 90 and the potential (/BL) appearing on the first complementary bit line 92 to the potential difference with the power supply voltage level, sends the potential difference to the data output circuit 129, and outputs requisite data therefrom (time t=t2(t2>t1) (FIGS. 6(F) and 6 (G))).

After that, at time t=t3, the column block selection signal (CBS) is driven to the "L" level (FIG. 6(C)). Thereupon, the ferroelectric capacitors in the memory cell 12a from which data were read out are rewritten to (time t=t3 (t3>t2)).

Last of all, at time t=t4, the row address selection signal (RAdd) and the column address selection signal (CAdd), respectively, are driven to the "L" level, thereby making the first sub-word line 130 (WL) and the main word line 138 inactive, and ending the read-out operation (time t=t4 (t4>t3)).

In this device, as has already been described, what conventionally has been one word line is divided between or into two sub-word lines, which sub-word lines are connected to a main word line. Also, the plurality of memory cells that conventionally has been connected to one word line are divided between or into two memory cell groups, 12 and 14, and plate lines and sub-word lines are provided for each of these memory cell groups. Hence the number of memory cells connected to a plate line and sub-word line is halved from what it was conventionally. Accordingly, the load capacitance placed on these plate lines and sub-word lines becomes smaller than conventionally and, therefore, the transistor size in the plate driver for driving one plate line to either the "H" or "L" level, and the transistor size in the sub-word driver that drives one sub-word line can be made smaller than conventionally. Furthermore, since the sub-word lines connected to the sub-word drivers are connected only to the memory cells that configure one memory cell group, the lengths thereof are short and the capacitance placed thereon is small. Accordingly, it is possible to shorten the sub-word line rise delay time. Similarly, since the plate lines connected to the plate drivers are also connected only to the memory cells configuring one memory cell group, the lengths thereof are short and the capacitance placed thereon is small. Accordingly, plate line rise delay time can also be shortened.

In the device of this embodiment, furthermore, the plate drivers are made to drive by the sub-word lines being active and by column block selection signals generated by the row decoder enabling (or energizing) signals and the column address selection signals. The sub-word drivers, on the other hand, are made to drive by the energizing of the row decoders and the column address selection signals. Accordingly, the activation and deactivation of both the plate lines and the sub-word lines are respectively controlled by the column address selection signals, wherefore the rise delay time and fall delay time on both lines can be shortened. Thus the device drive times can be shortened.

In the device of this embodiment, moreover, because driving can be effected for each memory cell group, power consumption can be reduced.

<Third Embodiment>

Figure 7:
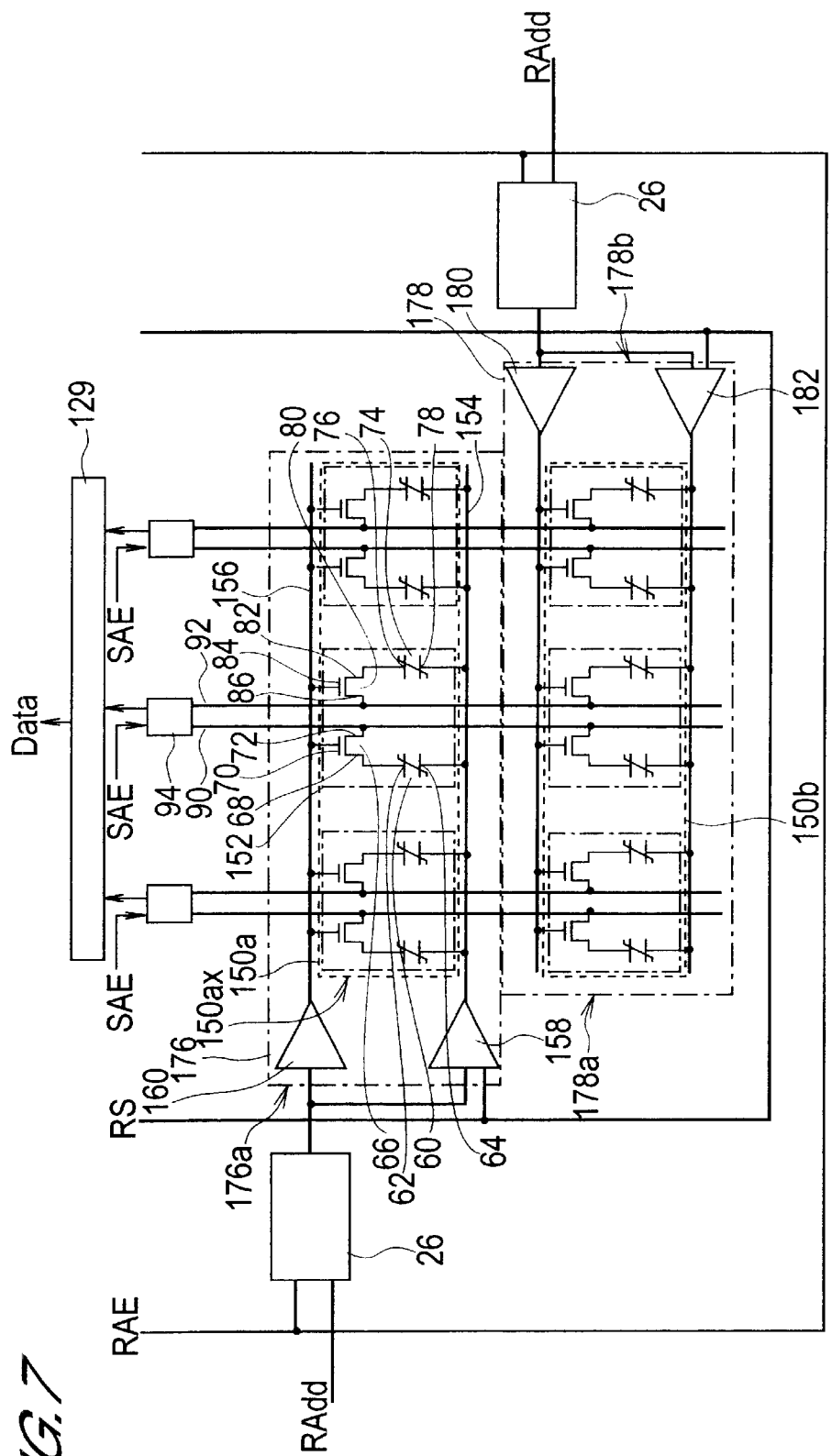
FIG. 7 is a schematic configuration diagram of a ferroelectric memory device in a third embodiment of the present invention.

FIG. 7 shows the configuration of a ferroelectric memory device according to a third embodiment of the present invention.

The ferroelectric memory device shown in FIG. 7 has memory cell groups 150a and 150b respectively configured by pluralities of memory cells. A memory cell group can contain, as shown, 6 memory cells. The plurality of memory cells (specifically, memory cell 152, for example) configuring one memory cell group, specifically, memory cell group 150a, for example, is connected respectively to a common plate line 154 and to a common word line 156. The plate line 154 is made either active or inactive by a plate driver 158 connected to one end of the plate line 154. The word line 156 is made active or inactive by a word driver 160 connected to one end of the word line 156. The word driver 160 is made to drive when the row decoder 26 is driven by the logical product of the row decoder enabling (or energizing) signal and the row address selection signal. The plate river 158, on the other hand, is made to drive when the row decoder 26 is driven and a control signal is applied from the outside. Accordingly, the plate driver 158 is made to drive by the driving of the row decoder 26 in the same way as the word driver 160. Moreover, the plate driver 158 is not connected to the word line 156. The control signal applied from the outside to the plate driver 158 may be made the row address selection signal or the column address selection signal.

The plate driver 158 is connected via a new wired line to the wired line between the row decoder 26 and the word driver 160. To the plate driver 158 and the word driver 160, moreover, are connected a plate line 154 and word line 156, each extending in the column direction. In this example, the memory cells configuring the memory cell group 150a are connected to the plate line 154 and the word line 156. Accordingly, whereas conventionally the word driver and plate driver are provided on both sides, via the word line, with the memory cell array sandwiched in between, in this example, the word driver 160 and plate driver 158 are provided on the same side 150ax relative to the memory cell group 150a to which the plate line 154 and word line 156 are connected.

For the plate driver 158 in this embodiment, the circuits shown in FIGS. 2(A) and (B) and described in conjunction with the first and second embodiments can be used, for example. In the case of the circuit shown in FIG. 2(A), a wired line 33 for control signal input is connected to the first main electrode 32 of the MOSFET 30. To the second main electrode 34 thereof is connected the plate line 154. Also, the control electrode 36 of the MOSFET 30 and the row decoder 26 are connected by a wired line. In the case where the circuit shown in FIG. 2(B) is used, two inverter circuits 48 may be connected in series between the first main electrode 42 of the MOSFET 40 and the wired line 43 for control signal input. Otherwise, the configuration is the same as with the circuit shown in FIG. 2(A).

Figure 8:
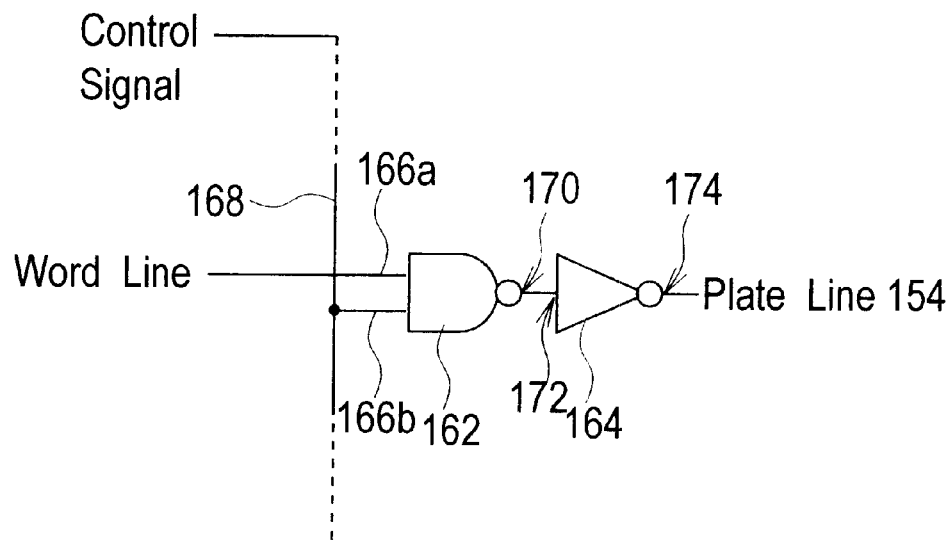
FIG. 8 is a schematic circuit diagram representing one example of a plate driver used in the ferroelectric memory device of the third embodiment for explaining the present invention.

For the plate driver 158 in this embodiment, a circuit like that shown in FIG. 8 may be used. The circuit shown in FIG. 8 is a circuit wherein a NAND circuit 162 and an inverter circuit 164 are connected in series. Of the two input terminals 166 of the NAND circuit 162, one thereof, the input terminal 166a, is connected to the row decoder 26, while the other, the input terminal 166b, is connected to the control signal input wired line 168. The output terminal 170 of the NAND circuit 162 is connected to the input terminal 172 of the inverter circuit 164. The output terminal 174 of the inverter circuit 164 is connected to the plate line 154. Therefore, when an "H" level signal output from the row decoder 26 is input to the input terminal 166a of the NAND circuit 162, and a control signal is input to the input terminal 166b thereof, an "L" level signal is output from the output terminal 170 of the NAND circuit 162. Also, an "L" level signal will be input to the input terminal 172 of the inverter circuit 164 connected to the output terminal 170. After that, an "H" level signal is output from the output terminal 174 of the inverter circuit 164. That output terminal 174 is connected to the plate line, and the plate line is made active (goes to "H" level) by the "H" level signal output from the output terminal 174.

Furthermore, the structure that comprises one memory cell group 150a, the plate line 154 and word line 156 connected to the memory cells configuring the memory cell group 150a, the plate driver 158 connected to the plate line 154, and the word driver 160 connected to the word line 156 is herein termed the first block 176, for example. The structure is shown by enclosing it in the dot and dash line in FIG. 7. Such a first block 176 as this is provided in a plurality in a direction that crosses at right angles the word line 156 or the plate line 154 (that is, parallel to the bit line 90 and the complementary bit line 92). In this embodiment, the plate drivers and word drivers for blocks that are adjacent to each other in the row direction are not provided on the same side of the block(s). In the layout shown in FIG. 7, consider the first block 176 in the first row and the second block 178 in the second row adjacent thereto. The word driver 160 and plate driver 158 for the first block 176 are provided on one side 176a of the first block 176, that is, on the left side (on the surface of the paper) in FIG. 7. Contrasting thereto, the word driver 180 and plate driver 182 for the second block 178 are provided, not on the same side 178a of the second block 178, but on the other side 178b thereof, that is, on the right side (on the surface of the paper) in FIG. 7.

The configuration of the memory cells is assumed to be the same configuration as in the first and second embodiments.

According to the configuration of the ferroelectric memory device in this embodiment, the plate drivers are not connected to a word line. That being so, the load capacitance placed on the word line is reduced from what it is conventionally by the measure of the plate driver(s). Accordingly, the word line rise speed and fall speed can be made high-speed. Because the word line operating speed can also be shortened as a consequence, overall device power consumption can be reduced. Furthermore, because the plate drivers and word line(s) are not connected, no redundant wiring is provided in this device, and connections are easy to make.

The operation of reading out data from the ferroelectric memory device in this embodiment is the same as in the second embodiment.

First, the row decoder 26 is selected by the row decoder energizing signal and the row address selection signal, and an "H" level signal is output from the row decoder. Here, the row decoder 26 connected to the first block 176 is selectively driven. By the row decoder 26 being selected, the word driver 160 is made to drive, and the word line 156 connected to the word driver 160 is made active. By the selection of the row decoder 26, furthermore, the plate driver 158 is put in a wait state. Next, when a control signal is applied to the plate driver 158 (driving the control signal to the "H" level), the plate driver 158 drives, and the plate line 154 connected to the plate driver 158 is made active. The control signal may be either a row address selection signal or a column address selection signal. Thereupon, a read-out potential appears on the bit line 90 and on the complementary bit line 92. Next, a sense amplifier drive signal is applied to the sense amplifier 94 connected to the bit line 90 and the complementary bit line 92. After that, the control signal is driven to the "L" level, and the ferroelectric capacitors inside the memory cell read out from are rewritten to. Then the row address selection signal is driven to the "L" level and the word line 156 is made inactive, whereupon the read-out operation ends.

<Fourth Embodiment>

Figure 9:
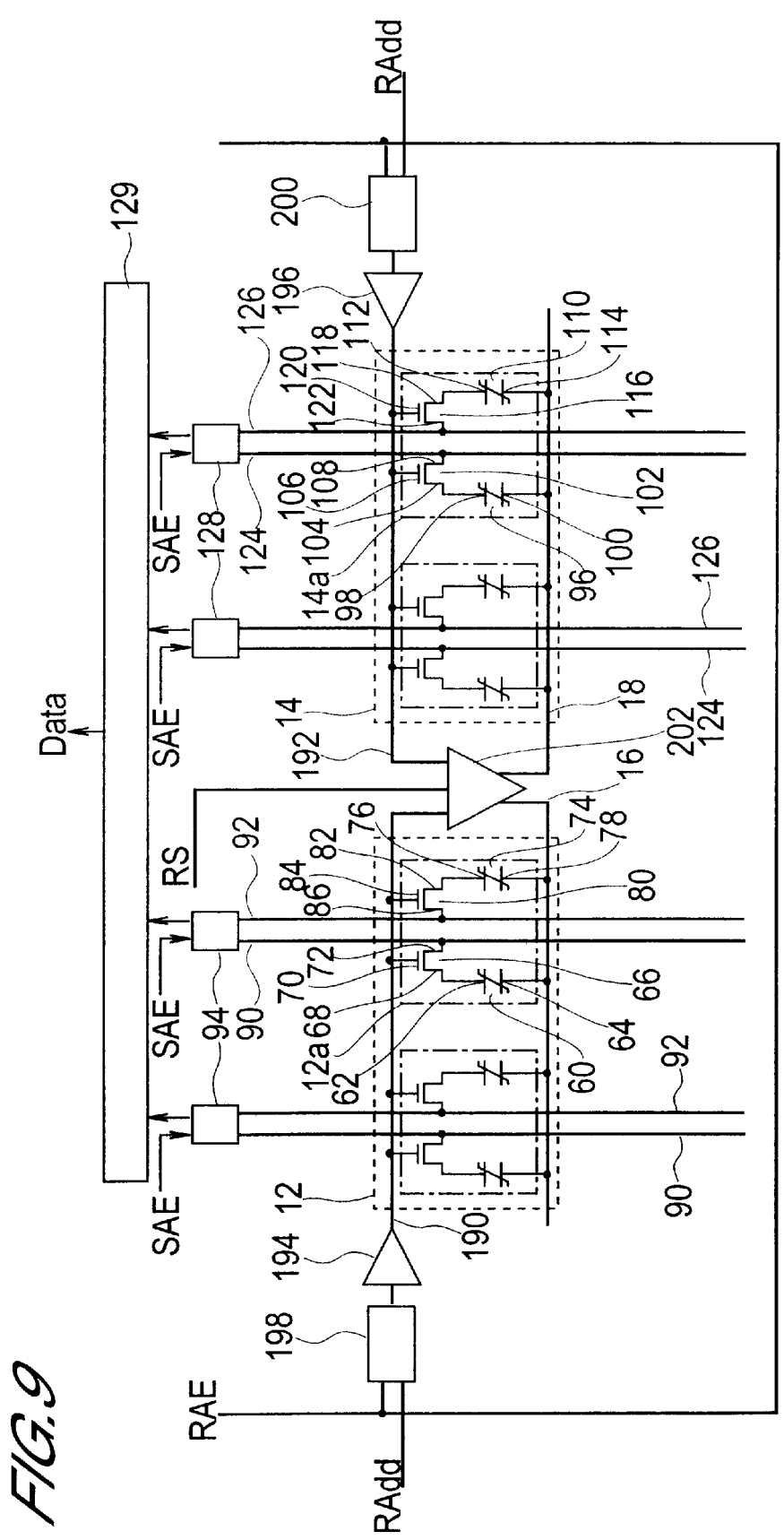
FIG. 9 is a schematic configuration diagram of a ferroelectric memory device in a fourth embodiment of the present invention.
Figure 11:
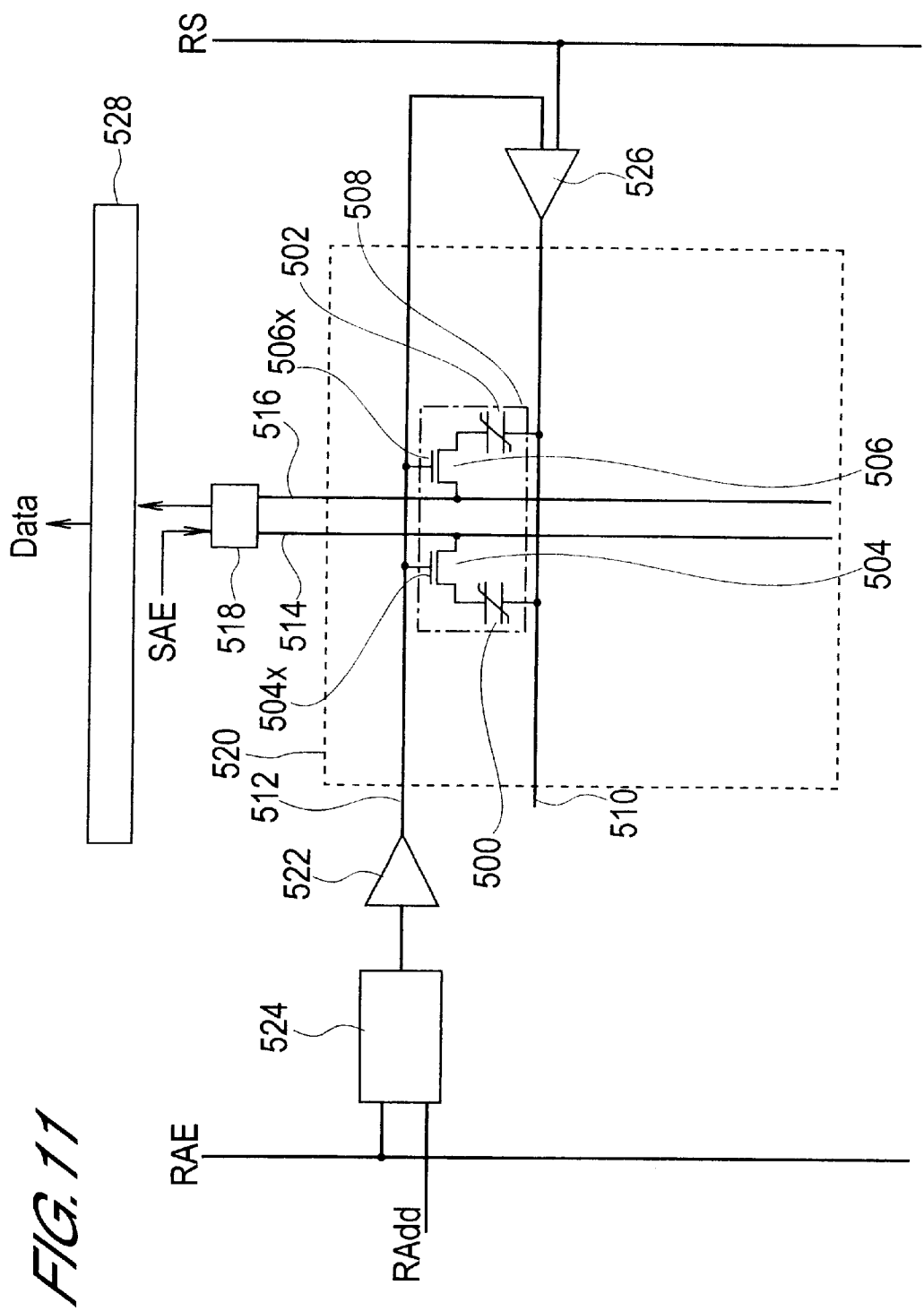
FIG. 11 is a configuration diagram for a conventional ferroelectric memory device.

FIG. 9 shows the configuration of a ferroelectric memory device according to a fourth embodiment of the present invention.

The ferroelectric memory device has two memory cell groups configured by pluralities of memory cells. A memory cell group can contain, as shown, four memory cells. The plurality of memory cells configuring one memory cell group is connected to a common plate line and a common word line.

In this example, the two memory cell groups are designated the first memory cell group 12 and the second memory cell group 14. Also, the plate line and word line connected to each of the memory cells (specifically, the memory cell 12a, for example) configuring the first memory cell group 12 are designated the first plate line 16 and the first word line 190. The plate line and word line connected to each of the memory cells (specifically, the memory cell 14a, for example) configuring the second memory cell group 14 are designated the second plate line 18 and the second word line 192.

Each word line is made either active or inactive by a word driver provided for each memory cell group. In this example, the first word line 190 is made active by the drive (i.e. output of an "H" level signal) of the first word driver 194, and the second word line 192 is made active by the drive (i.e. output of an "H" level signal) of the second word driver 196. These word drivers are driven by the selective driving of row decoders which are connected to the word drivers. In this example, the a first row decoder 198 is connected to the first word driver 194, and a second row decoder 200 is connected to the second word driver 196. These row decoders are selectively driven by row decoder enabling (or energizing) signals and row address selection signals. In the case of selectively driving the first row decoder 198, for example, the first row decoder 198 and the second row decoder 200 are put into a wait state by a row decoder enabling signal and, either simultaneously therewith or thereafter, the first row decoder 198 alone is selectively driven by applying a row address selection signal to the first row decoder 198.

Now, either the plate line connected to one or other of the memory cell groups or the plate lines connected to both memory cell groups are driven to the "H" level or "L" level by a plate driver 202 that is common to the two memory cell groups 12 and 14. In this example, the plate driver configuration is shown in FIG. 10.

Figure 10:
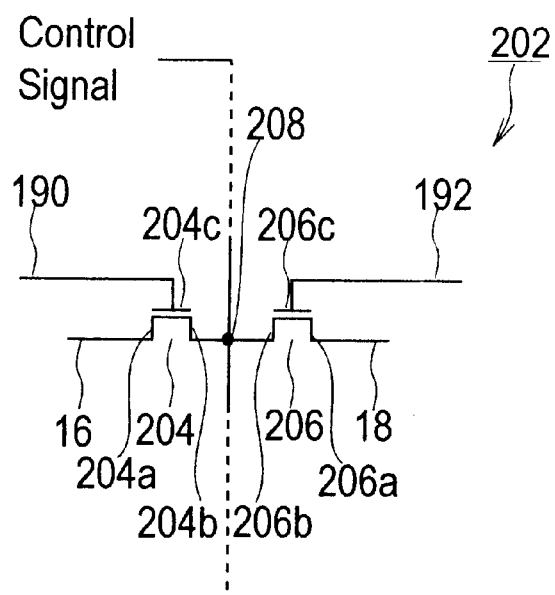
FIG. 10 is a schematic circuit diagram representing one example of a plate driver used in the ferroelectric memory device of the fourth embodiment for explaining the present invention.

Based on the structure shown in FIG. 10, the plate driver 202 in this embodiment comprises a first MOSFET 204 and a second MOSFET 206. The first MOSFET 204 and the second MOSFET 206 have their main current paths connected in series. The first main electrode 204a of the first MOSFET 204 is connected to the first plate line 16, and the first main electrode 206a of the second MOSFET 206 is connected to the second plate line 18. Also, the second main electrode 204b of the first MOSFET 204 and the second main electrode 206b of the second MOSFET 206 are connected. Also, to the junction 208 therebetween is wired a line so that control signals are applied from the outside. To the control electrode 204c of the first MOSFET 204 is connected the first word line 190, and to the control electrode 206c of the second MOSFET 206 is connected the second word line 192.

The plate driver 202, configured thusly, drives or outputs an "H" level signal when either one or both word lines goes active or effects an "H" level output signal and a control signal is applied from the outside. Accordingly, when the first row decoder 198 is selected and the first word line 190 becomes active, a signal is applied to the control electrode 204c of the first MOSFET 204, whereupon the first MOSFET 204 is put in a conducting state. Next, when a control signal is applied to the junction 208, a charge moves from the second main electrode 204b to the first main electrode 204a in the first MOSFET 204, causing the first plate line 16 to go active.

The memory cell configuration is assumed to be the same as in the first, second, and third embodiments.

Based on the configuration of the ferroelectric memory device in this embodiment, a common plate driver 202 is provided for the two memory cell groups 12 and 14, wherefore the total number of transistors decreases, and it is also possible to make the wiring for the control signals for causing the plate driver 202 to drive to be made common to two plate lines. Thus the layout area can be made smaller.

Turning to the operation of reading out data from the ferroelectric memory device of this embodiment, first a row decoder is selectively driven by a row decoder enabling signal and a row address selection signal. In this embodiment, the first row decoder 198 is selected. By the row decoder 198 being selected, the first word driver 194 is driven and the first word line 190 becomes active. Also, the plate driver 202 is put in a wait state by the first word line 190 going active. Next, the control signal is driven to the "H" level, which causes the plate driver 202 to be driven and the first plate line 16 to become active. This control signal may be either a row address selection signal or a column address selection signal. When this is done, a read-out potential appears on the first bit line 90 and the first complementary bit line 92 of the first memory cell group 12. Next, a sense amplifier drive signal is applied to the sense amplifier 94 that is connected to the first bit line 90 and the first complementary bit line 92. Thereafter, the control signal is driven to the "L" level, and the ferroelectric capacitors in the memory cell read out from are rewritten to. Then the row address selection signal is driven to the "L" level and the first word line 190 is made inactive, thereby terminating the read-out operation.

In the device of this embodiment, the plurality of memory cells that conventionally is connected to one word line is divided into two memory cell groups, and a word line and plate line are provided for each of these memory cell groups. Accordingly, the number of memory cells connected to any one word line and any one plate line is fewer than conventionally. Hence the lengths of these lines may be made shorter and the capacitance acting thereon is small. For these reasons, the word line and plate line rise delay times and fall delay times can be made shorter than conventionally, and hence the device operating speed can be made high-speed.

As should be clear from the foregoing descriptions, based on the ferroelectric memory device of the present invention, there is a word line to which a plurality of memory cells are connected, and those memory cells are divided into at least two memory cell groups. The memory cells configuring one memory cell group are connected to a common plate line. The plate line is made active (the "H" level) or inactive (the "L" level) by a plate driver that is provided for each memory cell group. Each of those plate drivers is connected to a word line, and at least one of the plate drivers is connected to a portion of the word line that is between adjacently connected memory cell groups.

As based on this device, the plurality of memory cells connected to one word line are divided into a plurality of memory cell groups, and a plate line is provided for each of those memory cell groups. For that reason, the transistor size in the plate driver that activates or deactivates one plate line may be made smaller than conventionally. These plate drivers are connected to the word line, furthermore, but at least one of those plate drivers is connected to the word line at a position that is between adjacently connected memory cell groups. For that reason, the load capacitance placed on the word line can be reduced and, accordingly, the word line rise time can be shortened. Also, because the plurality of memory cells is divided into two or more memory cell groups, and a plate line is provided for each of those memory cell groups, the number of memory cells connected to any one plate line can be made fewer than conventionally and, accordingly, the load capacitance placed on the plate line can be made far smaller than conventionally. Furthermore, because the transistor size in the plate drivers that drive the plate lines can be made small, transistor parasitic resistance and parasitic capacitance are reduced. For that reason, the plate line rise time can also be shortened. Accordingly, a ferroelectric memory device can be provided having an operating speed that is faster than conventionally.

Furthermore, in a ferroelectric memory device having memory cell groups configured by pluralities of memory cells, wherein the pluralities of memory cells are connected to common plate lines and common sub-word lines, the common plate lines and common sub-word lines are made active or inactive by a plate driver and a sub-word driver provided for each memory cell group, respectively, those plate drivers are connected to the sub-word lines, the sub-word drivers are connected to main word lines, and the main word lines are connected to row decoders, the operating process steps described below in (1) to (4) are negotiated in performing data read-out operations.

(1) A step for causing a row decoder to be selectively driven by inputting to the row decoder a row decoder energizing signal and a row address selection signal.

(2) A step for putting a sub-word driver in a wait state by inputting to the main word line a first level output from the row decoder by selecting and driving the row decoder, and making the main word line active.

(3) A step for causing a sub-word driver to drive and making a sub-word line active by applying a column address selection signal to a sub-word driver that is in the wait state, and, by making the sub-word line active, putting a plate driver connected to the sub-word line in a wait state.

(4) A step for inputting a row decoder energizing signal and a column address selection signal to a column block selection circuit and thereby inputting the column block selection signal output from the column block selection circuit to a waiting plate driver so as to cause the plate driver to drive and activate a plate line.

Thus it is possible to control the drive of the plate drivers by column address selection signals, and therefore to shorten the operating time.

What is claimed is:

1. A ferroelectric memory device comprising:
   a memory array in which a plurality of memory cells driven simultaneously are divided into a plurality of memory cell groups;
   a word line which is commonly connected to all of said memory cells which are driven simultaneously;
   a plurality of plate lines which are arranged at every memory cell group, and each of which is commonly connected to all memory cells in the corresponding memory cell group; and
   a plurality of plate drivers, in which input terminals of said plate drivers are connected to the word line and output terminals of said plate drivers are connected to the plate lines, wherein all of the plate drivers simultaneously supply a same one of a high level and a low level to the plate lines.

2. A ferroelectric memory device according to claim 1, wherein said plate drivers select memory cell groups that operate according to said word line and control signals from outside.

3. A ferroelectric memory device according to claim 2, wherein said control signals are row address selection signals or column address selection signals.

4. The ferroelectric memory device of claim 1, wherein each of said memory cell groups comprises four memory cells.

5. A ferroelectric memory device comprising a plurality of memory cell groups of at least four memory cell wherein:
   said memory cells in each said memory cell group are commonly connected to the same one of at least two plate lines and the same one of at least two sub-word lines;
   each of said plate lines and said sub-word lines is driven to high level or low level by plate drivers and sub-word drivers provided for each of said memory cell groups, respectively;
   said plate drivers are connected to said sub-word lines; and
   said sub-word drivers are connected, respectively, to a main word line.

6. A ferroelectric memory device according to claim 5, wherein said sub-word drivers are driven by said main word line according to a row decoder selectively driven by a row decoder enabling signal and a row address selection signal, and by a column address selection signal.

7. A ferroelectric memory device according to claim 5, wherein said plate drivers are driven by said sub-word lines becoming active and by a column block selection signal output from a column block selection circuit by a row decoder enabling signal and a column address selection signal being input to said column block selection circuit.

8. A ferroelectric memory device comprising:
   a memory array in which a plurality of memory cells driven simultaneously are divided into a plurality of memory cell groups;
   a plurality of word lines which are arranged at every memory cell group, and each of which is commonly connected to a memory cells in the corresponding memory cell group;
   a plurality of plate lines which are arranged at every memory cell group, and each of which is commonly connected to all memory cells in the corresponding memory cell group;
   a row decoder;
   a plurality of word drivers, in which input terminals of said word drivers are commonly connected to the row decoder and output terminals of said word drivers are connected to the word lines, wherein the row decoder controls said word drivers such that all of the plurality of memory cells are supplied a same one of a high level and a low level by driving the word lines simultaneously; and
   a plurality of plate drivers in which output terminals are connected to the plate lines and which supply a high level or a low level to the plate lines in response to the word drivers.

9. A ferroelectric memory device according to claim 8, wherein said row decoder is selectively driven by a row address selection signal and a row decoder enabling signal being input to said row decoder.

10. A ferroelectric memory device according to claim 8, wherein said plate drivers are driven by control signals, said control signals are row address selection signals or column address selection signals.

11. A ferroelectric memory device according to claim 8, wherein said plate drivers are connected to a wired line between said row decoder and said word driver through a separate wired line.

12. A ferroelectric memory device according to claim 8, wherein: a plurality of blocks comprising said memory cell groups, plate lines, word lines, plate drivers, and word drivers is arrayed in one queue in a direction perpendicular either to said word lines or to said plate lines; and said plate drivers and word drivers for blocks adjacent to one another are not provided on same side relative to said blocks.

13. A ferroelectric memory device comprising:
   a plurality of memory cell groups of at least four memory cells and a number of bit lines equal to the number of memory cells, wherein each memory cell in a memory cell group is coupled to a different one of said bit-lines and wherein:
   each memory cell in a first one of said memory cell groups is commonly connected to a first one of a plurality of plate line and a first one of a plurality of word lines;

each memory cell in a second one of said memory cell groups is commonly connected to a second one of said plate lines an a second one of said word lines;

a common plate driver connected to said first and second ones of said plate lines and said first and second ones of said word lines;

said word lines are driven to a high level or a low level by a word driver provided for each memory cell group;

said plate lines are such that, at least one of said first and second ones of said plate lines are activated or deactivated by said common plate driver;

said word driver drives when a row decoder connected to said word driver is selectively driven and a high level output is input to said word driver; and said plate driver drives when at least one of said first and second ones of said word lines become active and a control signal from outside is applied.

14. A ferroelectric memory device according to claim 13, wherein each of said row decoders is selectively driven, and generates a high level output, by a row address selection signal and a row decoder enabling signal being input to said row decoder.

15. A ferroelectric memory device according to claim 13, characterized that said control signal is a row address selection signal or a column address selection signal.

16. A ferroelectric memory device according to claim 13, wherein: said plate driver comprises two MOSFETs having a common source; said source is connected to a row address selection signal line or a column address selection signal line; gate of one MOSFET of said two MOSFETs is connected to a word line common to one memory cell group, while drain thereof is connected to a plate line common to said one memory cell group; and gate of other MOSFET of said two MOSFETs is connected to a word line common to other memory cell group, while drain thereof is connected to a plate line common to said other memory cell group.

17. A ferroelectric memory device operation method, wherein said ferroelectric memory device has memory cell groups comprising a plurality of at least four memory cells, wherein said plurality of memory cells in each of said memory cell groups are commonly connected to a plate line and a sub-word line, said plate lines and said sub-word lines are activated or deactivated by plate drivers and sub-word drivers provided for each memory cell group, respectively, said plate drivers are connected to said sub-word lines, said sub-word drivers are connected respectively to a main word line, and said main word line is connected to row decoders, the method comprising:

selectively driving said row decoder by inputting a row decoder enabling signal and a row address selection signal to said row decoder;

putting said sub-word drivers into a wait state by selective driving of said row decoders, whereby a high level output is input to said main word line from said row decoder and said main word line is activates;

driving said sub-word driver, and activating said sub-word line, when a column address selection signal is applied to said sub-word driver in a wait state, and putting said plate driver connected to said sub-word line in a wait state by said sub-word line becoming active; and inputting to said plate driver in a wait state both a column block selection signal output from a column block selection circuit by said row decoder enabling signal, and said column address selection signal being input to said column block selection circuit, thereby driving said plate driver, and activating said plate line.

18. A ferroelectric memory device operation method wherein said ferroelectric memory device has memory cell groups comprising a plurality of at least four memory cells, in a configuration wherein said plurality of memory cells in each of those memory cell groups are commonly connected to a plate line and a word line, said plate line and word line are connected respectively to a plate driver and word driver, said plate driver and word driver are connected respectively to a row decoder, and to said plate drivers are applied control signals from outside, the method comprising:

driving said row decoder selectively, and causing said row decoder to generate a high level output, by inputting to said row decoder a row decoder enabling signal and a row address selection signal;

driving said word driver, activating said word line, and putting said plate driver in a wait state, by inputting said high level output to said word driver and said plate driver; and driving a plate driver, and activating said plate line, by applying a control signal to said plate driver in a wait state.

* * * * *